United States Patent [19]
Okutani

[11] Patent Number: 5,135,608
[45] Date of Patent: Aug. 4, 1992

[54] METHOD OF PRODUCING SEMICONDUCTOR DEVICES

[75] Inventor: Ken Okutani, Fussa, Japan

[73] Assignee: Hitachi, Ltd., Tokyo, Japan

[21] Appl. No.: 550,694

[22] Filed: Jul. 10, 1990

[30] Foreign Application Priority Data

Jul. 11, 1989 [JP] Japan ................... 1-178718
May 7, 1990 [JP] Japan ................... 2-115751

[51] Int. Cl.$^5$ .............. H01L 21/306; B44C 1/22; C03C 15/00; C23F 1/00
[52] U.S. Cl. ................... 156/643; 156/345; 156/646; 156/656; 156/662; 118/728; 118/50.1; 118/620; 204/298.25; 204/298.35
[58] Field of Search ........... 156/643, 644, 646, 345, 156/650, 656, 659.1, 662, 665; 118/728, 50.1, 620; 427/38, 39; 204/192.1, 192.12, 192.32, 192.35, 298.25, 298.35

[56] References Cited

U.S. PATENT DOCUMENTS 4,825,808 5/1989 Takahashi et al. ............ 156/345 X

FOREIGN PATENT DOCUMENTS

| | | | |
|---|---|---|---|
| 0261588 | 11/1988 | Fed. Rep. of Germany | 156/345 |
| 55-72040 | 5/1980 | Japan | 156/345 |
| 61-67921 | 4/1986 | Japan . | |
| 61-210637 | 9/1986 | Japan . | |
| 61-212375 | 9/1986 | Japan . | |
| 61-173133 | 10/1986 | Japan . | |
| 61-224327 | 10/1986 | Japan . | |
| 63-155629 | 10/1988 | Japan . | |

Primary Examiner—William A. Powell
Attorney, Agent, or Firm—Antonelli, Terry Stout & Kraus

[57] ABSTRACT

A process and apparatus for producing semiconductor integrated circuit devices wherein the dry processing and the wet processing are continuously effected for the wafers to be processed, and the wafers are transferred between these processings under a vacuum condition or in a purging gas without being allowed to come in contact with the open air, to avoid adverse effects that will be caused by the open air.

40 Claims, 28 Drawing Sheets

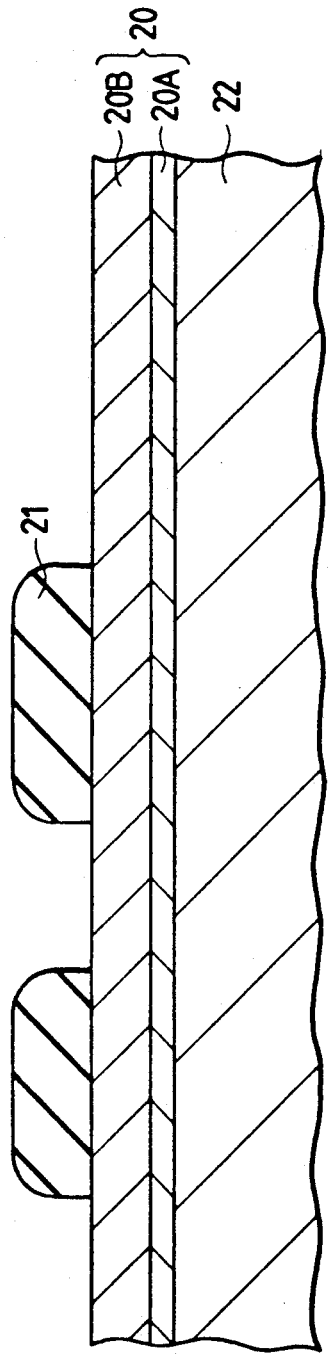
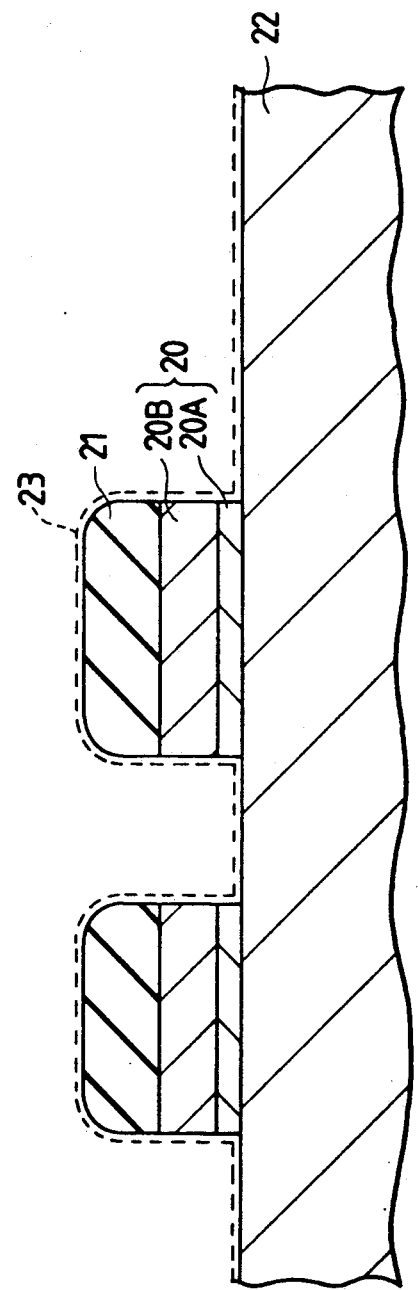
FIG. 2(a)
FIG. 2(b)

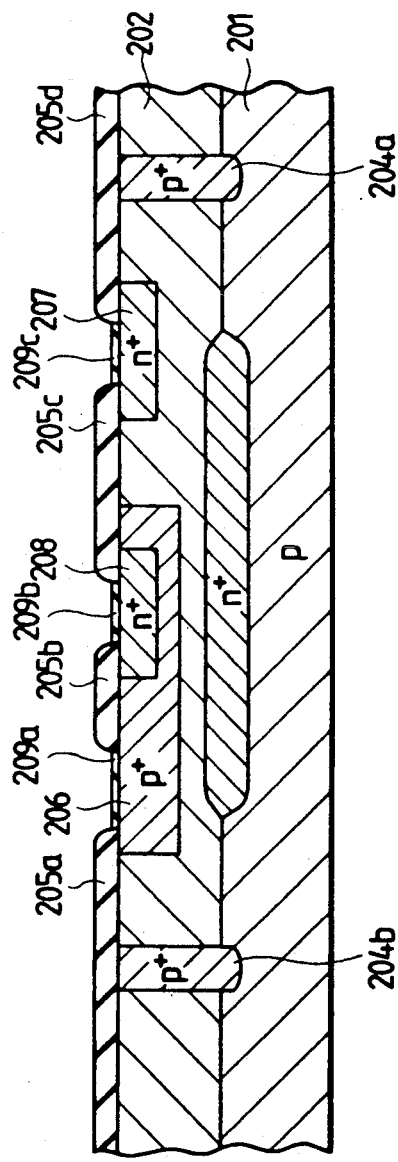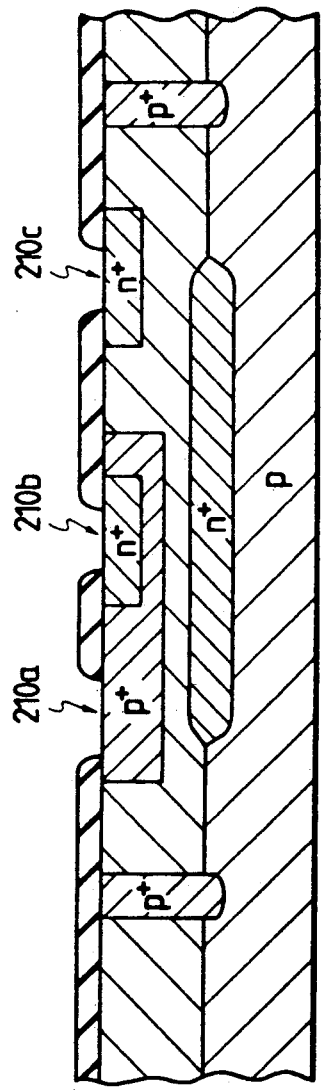

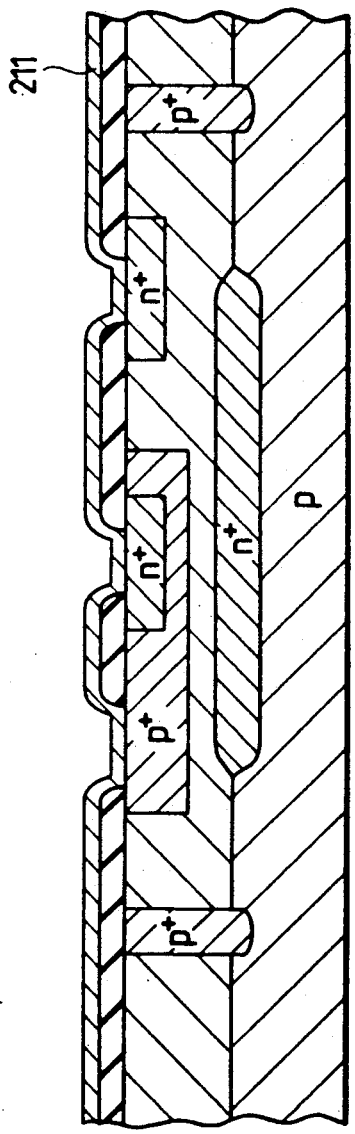
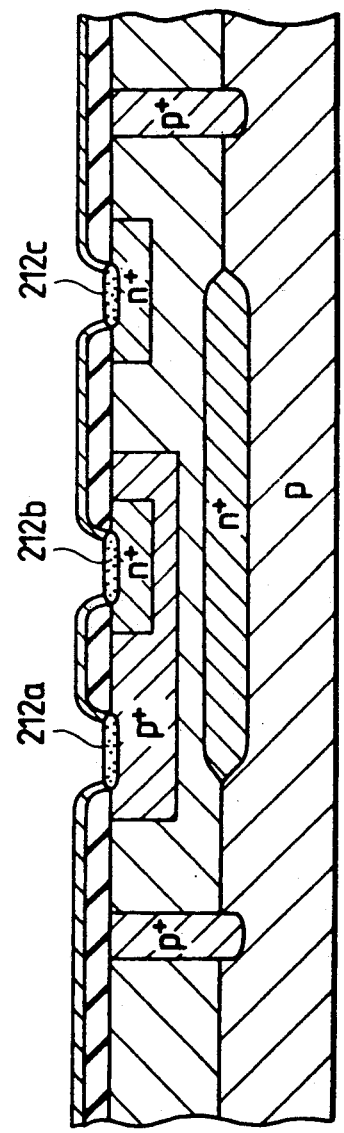
FIG. 10
FIG. 11

METHOD OF PRODUCING SEMICONDUCTOR DEVICES

BACKGROUND OF THE INVENTION

The present invention relates to semiconductor device technology and, particularly, to technology that can be effectively adapted to thin film-forming technology and etching technology in processing wafers use for semiconductor devices.

In processing wafers, there have been used washing apparatuses provided with a wet washing chamber and a dry washing chamber for the wafers, and wafer carrier means between these two processing chambers (Japanese Patent Laid-Open Nos. 67921/1986, 210637/1986, 212375/1986 and 224327/1986.

There has also been proposed a resist removal device in which the step of removing resist from the wafer is carried out in a wet processing chamber and in a dry processing chamber (Japanese Utility Model Laid-Open No. 155629/1988).

There has further been proposed a thin film-forming apparatus for forming thin films on wafers, using susceptors for holding the wafers, which comprises a film-forming unit for forming an insulating film on wafers placed on the susceptors, an etching unit for susceptors for wet etching the insulating film adhered on the susceptors, and a washing unit for susceptors for washing away with water the etching solution adhered to the susceptors at the time of etching the susceptors, which units are arranged in a path of an endless rotary member that holds a number of the susceptors (Japanese Utility Model Laid-Open No. 173133/1986).

SUMMARY OF THE INVENTION

In contrast with the above-mentioned technology, dry processing apparatuses such as sputtering apparatus, CVD (chemical vapor deposition) apparatus and dry etching apparatus, that effect predetermined processing of the wafers under vacuum conditions, do not incorporate wet processing mechanisms, such as a wafer washing mechanism, in a step before or after dry-processing the wafers.

Between the dry processing step using the dry processing apparatus and the wet processing step using the washing/drying apparatus, therefore, the wafers are transported exposed to the open air, or are temporarily stored causing the operation to be interrupted so as to deteriorate the operation efficiency.

In the sputtering apparatus and the CVD apparatus, on the other hand, the wafers are exposed to the open air during the transport or storage after the preceding step of wet processing by the washing/drying apparatus, i.e., after the removal of spontaneously oxidized film formed on the wafers. Therefore, spontaneously oxidized film is formed again on the wafers prior to forming a thin film.

In the dry etching apparatus, furthermore, the wafers are exposed to the open air during the transport or storage thereof after the step of dry-etching the aluminum film on the wafers. Therefore, chlorine in the chlorine-containing etching gas remaining on the wafers reacts with water in the open air causing the aluminum film to corrode (after corrosion) before the step of wet processing by the washing/drying apparatus.

The present inventors have discovered the fact that the probability of corrosion is very much higher in the barrier metal multilayer film, i.e., in a multilayer film of (1) barrier metal layers such as of Ti, TiW and MoSi and (2) an Al-Si layer, than in a single-layer film such as of Al-Si.

This great probability of corrosion is attributed to the structural factors of the multilayer film in addition to the factor of cell effect by different kinds of metals.

Accordingly, an object of the present invention is to provide semiconductor device technology (e.g., apparatus and process) which is capable of effecting dry processing and wet processing for substrates (e.g., wafers) used, e.g., for semiconductor devices (e.g., silicon wafers for semiconductor devices) without permitting the wafers to become defective by reaction with the external air, and which also helps improve the operation efficiency of this processing.

Generally, the foregoing objective is accomplished by a method and apparatus wherein the substrates are subjected to wet processing and dry processing without exposing the substrates to external (open) air between the wet processing step and the dry processing step.

Among the inventions disclosed in this application, a representative example will now be simply described. This representative example is illustrative and not limiting.

That is, a method of producing semiconductor devices of the present invention comprises a dry processing step and a wet processing step for the wafers, and a step for carrying (transporting) wafers between the dry processing step and the wet processing step, wherein said dry processing step, said wet processing step and said carrier (transport) step are continuously carried out in a predetermined atmosphere in he processing apparatus shutting off the open air.

An apparatus for producing semiconductor devices of the present invention comprises at least a dry processing mechanism and a wet processing mechanism for the wafers, and a mechanism for carrying (transporting) the wafers between the dry processing mechanism and the wet processing mechanism, said mechanisms being allowed to be shut off from the open air, respectively.

According to the above-mentioned method of producing semiconductor devices of the present invention, in which the dry processing step and the wet processing step for the wafers, and the carriage (transport) step are continuously carried out in a predetermined atmosphere in processing apparatus that shuts out the open air, the operation efficiency can be improved in the dry processing step and in the wet processing step for the wafers, yet the wafers are reliably prevented from becoming defective due to reaction with the open air, i.e., formation of a spontaneously oxidized film or the generation of corrosion on the wafers is reliably prevented.

The apparatus for producing semiconductor devices of the present invention, incorporated a dry processing mechanism and a wet processing mechanism for the wafers, and the carriage (transport) mechanism, can reduce the space for the apparatus for dry-processing and wet-processing the wafers. Furthermore, since the above-mentioned mechanisms are shut off from the open air, the wafers are reliably prevented from becoming defective due to reaction with the open air.

BRIEF DESCRIPTION OF THE DRAWINGS

FIGS. 2(a), 2(b), 2(c) and 2(d) are sectional views of a wafer for explaining a method of producing semiconductor devices according to the first embodiment of the present invention.

FIGS. 8 to 30 are sectional views schematically illustrating a wafer to explain a major process flow in the production steps of a bipolar integrated circuit device according to the second embodiment.

DETAILED DESCRIPTION OF THE INVENTION

Embodiment 1

Figure 1:
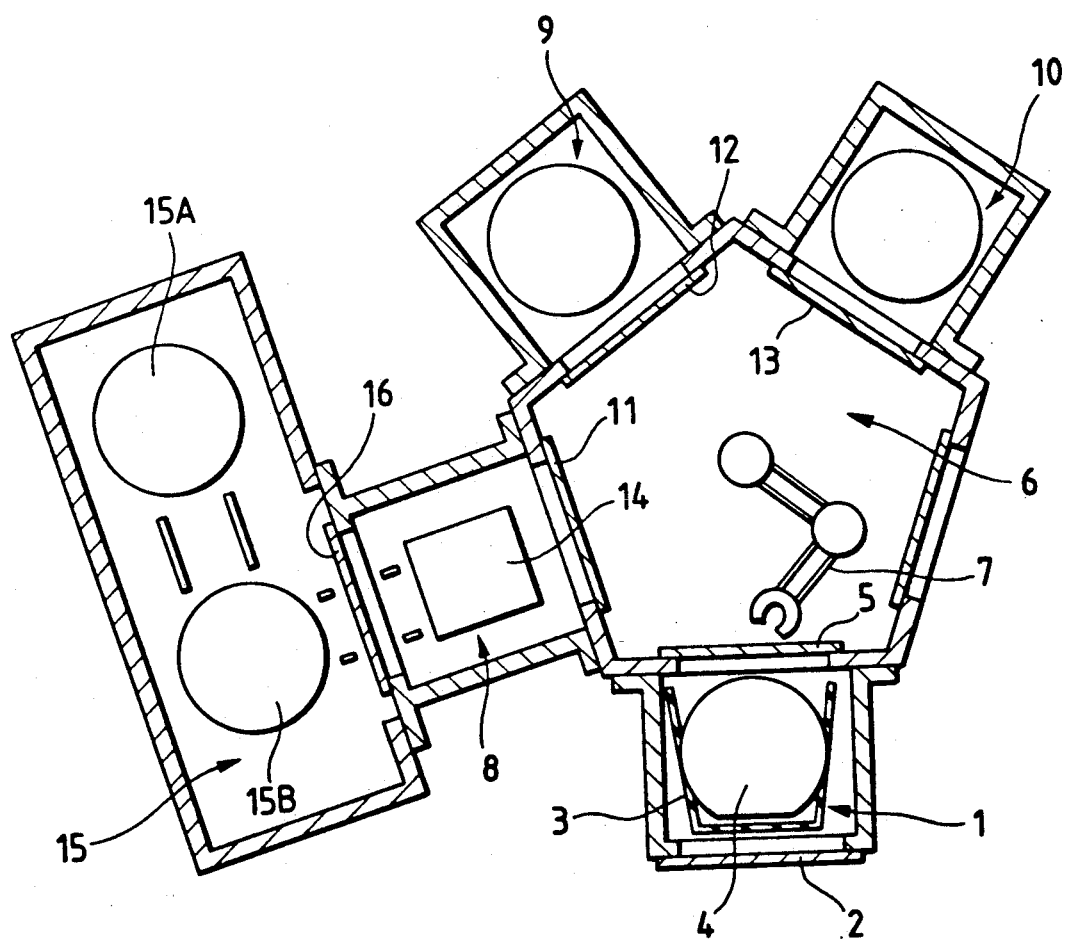
FIG. 1 is a diagram schematically illustrating an apparatus for producing semiconductor devices according to a first embodiment of the present invention.

FIG. 1 is a diagram which schematically illustrates an apparatus for producing semiconductor devices according to a first embodiment of the present invention, and FIGS. 29(a), 2(b), 2(c) and 2(d) are sectional views of a wafer for explaining the method of producing semiconductor devices according to the first embodiment of the present invention.

The apparatus for producing semiconductor devices according to this embodiment is of the single-wafer type, and is equipped with a vacuum load/unload chamber 1 that is capable of effecting the evacuation as shown in FIG. 1.

In the vacuum load/unload chamber 1 is provided a wafer cassette 3 which can be put in or put out through the opening/closing operation of a partitioning valve 2, and a wafer 4 (or plurality of wafers) is held in the wafer cassette 3. The opening of vacuum load/unload chamber 1, closed off by positioning valve 2, is longer and wider than cassette 3, so that the cassette 3, with wafers, can be loaded/unloaded to and from the vacuum load/unload chamber 1.

The vacuum load/unload chamber is juxtaposed with a vacuum carriage chamber 6 (carriage mechanism) via the partitioning valve 5.

Carriage means 7 comprising a robot arm or the like is installed in the vacuum carriage chamber 6 that is capable of effecting the evacuation.

The vacuum carriage chamber 6 (carriage mechanism) is surrounded by a vacuum load lock chamber 8, an etching chamber 9 (dry processing mechanism) and a sputter chamber 10 (dry processing mechanism). The vacuum load lock chamber 8, etching chamber 9 and sputtering chamber 10 are juxtaposed to the vacuum carriage chamber 6 via partitioning valves 11, 12 and 13, respectively.

The wafer 4 is carried by carriage means 7 according to any sequence between the vacuum load/unload chamber 1 and the vacuum carriage chamber 6, between the vacuum carriage chamber 6 and the vacuum load lock chamber 8, between the vacuum carriage chamber 6 and the etching chamber 9, and between the vacuum carriage chamber 6 and the sputter chamber 10 through the partitioning valves 5, 11, 12 and 13.

The vacuum load lock chamber 8 is capable of effecting evacuation and introducing an inert gas such as argon or nitrogen.

In the vacuum load lock chamber 8 is provided heating means 14 such as a heater; due to the heating means 14, water adsorbed by the wafer 4 is removed by a vacuum baking method.

A wet processing chamber 15 (wet processing mechanism) is juxtaposed to the vacuum load lock chamber 8 via a partitioning valve 16, and the wafer 4 is carried by a predetermined carriage means between the vacuum load lock chamber 8 and the wet processing chamber 15.

In the wet processing chamber 15 are arranged a washing unit 15A that effects spinner washing and a drying unit 15B that effects spin drying.

The interior of the wet processing chamber 15 can be purged with an inert gas such as nitrogen or the like.

The interior of the wet processing chamber 15 is purged with the inert gas such as nitrogen maintaining a pressure equal to or greater than the atmospheric pressure. Therefore, the wafer 4 in the wet processing chamber 15 does not come in contact with the external open air. After the spontaneously oxidized film is removed by washing in the washing unit 15A, water adhered at the time of washing is removed by the centrifugal force produced by the revolution of the spinner in the drying unit 15B.

Any remaining water on the wafer 4 which has been washed and dried in the wet processing chamber 15, is completely removed by a vacuum baking method using the heating means 14 in the vacuum load lock chamber 8 which is maintained under the vacuum condition. The wafer is then carried by carriage means 7 into the sputter chamber 10 via the vacuum carriage chamber 6 maintained under the vacuum condition. In the sputter chamber 10, a predetermined thin metal film such as an Al-Si alloy film or a like film is formed by sputtering on the wafer substrate such as of silicon.

Thereafter, the wafer 4 in the sputter chamber 10 is carried by carriage means 7 into the vacuum carriage chamber 6 maintained under the vacuum condition (illustratively, the same vacuum condition maintained in vacuum carriage chamber 6 when carrying the wafer 4 into sputter chamber 10) through the partitioning valve 13, carried into the vacuum load/unload chamber 1 through the partitioning valve 5, and is held in the wafer cassette 3 to complete a series of processing steps.

Next, the wafer 4 held in the wafer cassette 3 in the vacuum load/unload chamber 1 is carried by carriage means 7 into the etching chamber 9 through the partitioning valve 5, through the vacuum carriage chamber 6 maintained under the vacuum condition and through the partitioning valve 12.

The wafer 4 held in the wafer cassette 3 is the one obtained as shown, for example, in FIG. 2(a) by forming a photoresist film 21 on a multilayer film 20 of a barrier metal structure, i.e., the one obtained by forming a photoresist film 21 maintaining a predetermined pattern on a multilayer film 20 comprising a barrier metal layer 20A of Ti, TiW, MoSi deposited on a wafer substrate 22 such as of silicon or the like and an upper layer 20B comprising an Al-Cu-Si alloy deposited on the barrier metal layer 20.

The etching chamber 9 is maintained, for example, under a predetermined vacuum degree, and a chlorine-type reaction gas such as $BCl_3+Cl_2$ is introduced to effect reactive ion etching in order to form the thin metal film such as the multilayer film 20, into a predetermined wiring pattern. Such reactive ion etching is performed under conventional processing conditions.

After the wafer 4 is dry-etched and the chlorine-type reaction gas is forcibly evacuated, a mixture gas of, for example, FREON (trademark, i.e., $CF_4)+O_2$, or a single gas such as $O_2$ alone, is introduced into the etching chamber 9 where plasma discharge takes place to remove the photoresist film 21 from the wafer 4 by an ashing method, known in the art.

The wafer 4 from which the photoresist film 21 is removed in the etching chamber 9 is then carried into the wet processing chamber 15, through the vacuum carriage chamber 6 and the vacuum load lock chamber 8 that are shut off from the external open air, and is subjected to washing.

That is, after having passed through the washing/drying step in the wet processing chamber 15 shut off from the external open air, and after having passed through the heating/drying step in the vacuum load lock chamber 8 which is shut off from the external open air, the wafer 4 is carried through the vacuum carriage chamber 6 maintained under a vacuum condition and is held in the wafer cassette 3 in the vacuum load/unload chamber 1 to complete a series of processing steps.

Described below is a method of forming a thin metal film comprising aluminum on, for example, a silicon wafer substrate using apparatus of the first embodiment.

First, the wafer 4 such as a silicon wafer substrate held in the wafer cassette 3 in the vacuum load/unload chamber 1 is carried by carriage means 7 into the vacuum condition, through the partitioning valve 11, passing through the partitioning valvae 5 and the vacuum carriage chamber 6 maintained under the vacuum condition.

After partitioning valve 1 is closed, the vacuum load lock chamber 8 into which the wafer 4 is carried is filled with an inert gas such as argon.

Then, the wafer 4 is carried into the wet processing chamber 15 by a predetermined carriage means through the partitioning valve 16.

At this moment, the wet processing chamber 15 has been purged with an inert gas such as nitrogen maintaining a pressure equal to or greater than the atmospheric pressure.

In an atmosphere in the wet processing chamber 15 which is equal to or greater than the atmospheric pressure and which is shut off from the external open air, the wafer 4 is pre-washed by the washing unit 15A (e.g., washed with a hydrofluoric acid solution and then with pure water; here, the hydrofluoric acid solution is, for example, a mixture solution of hydrofluoric acid and water at a ratio of 1 to 99) to remove the spontaneously oxidized film from the wafer substrate. Then the adhered water is removed by the centrifugal force produced by the revolution of the spinner in the drying unit 15B.

Next, the wafer 4 is carried by the predetermined carriage means into the vacuum load lock chamber 8 through the partitioning valve 16 and, the vacuum load lock chamber 8 is evacuated.

At this moment, the wafer 4 is heated and dried by heating means 14 in vacuum, and water remaining on the wafer 4 is completely removed.

Thereafter, the wafer 4 in the vacuum load lock chamber 8 is carried by carriage means 7 into the sputter chamber 10 maintained under the vacuum condition via the partitioning valve 13 after having passed through the partitioning valve 11 and through the vacuum carriage chamber 6 maintained under the vacuum condition.

Then, a predetermined thin metal film such as of an Al-Si alloy is formed on the wafer substrate by sputtering in the sputter chamber 10.

In general, when a specific treatment is carried out under vacuum conditions, or the wafer is carried or held under vacuum conditions, the level of vacuum is preferably $5\times10^{-3}$ to $1\times10^{-6}$ Torr. This range is illustrative and is not limiting.

According to the production apparatus of the embodiment as described above, there are provided (1) the sputter chamber 10 for dry-processing the wafer 4, and (2) the wet processing chamber 15 for wet-processing the wafer 4, (3) the vacuum carriage chamber 6 having carriage means for transferring the wafer 4, between different chambers and (4) the vacuum load lock chamber 8 between the sputter chamber 10 and the wet processing chamber 15. Therefore, reduced space is required by the apparatus which effects the step of dry-sputtering the wafer and which also effects the preceding step of wet processing. Furthermore, the dry processing step and the wet processing step that are continuously carried out helps improve the operation efficiency.

According to the production apparatus and production method of the aforementioned embodiment, furthermore, the wafer 4 is continuously carried into the sputter chamber 10 passing through the vacuum load lock chamber 8 and the vacuum carriage chamber 6 and a thin metal film is formed thereon without exposing the wafer to the open air outside the production apparatus, i.e., without brining the wafer into contact with oxygen in the external open air during the wet processing of the wafer 4 (washing and drying of wafer 4) in the wet processing apparatus 15 and even after the above processing.

After the spontaneously oxidized film is removed from the wafer 4 in the wet processing chamber 15, therefore, the spontaneously oxidized film is reliably prevented from forming again on the wafer 4 by contact with external open air before the thin metal film is formed on the wafer in the sputter chamber 10, and the contact resistance can be decreased between the wafer substrate and the thin metal film.

Next, described below is the case where a multilayer film 20 of, for example, a barrier metal structure is to be dry-etched by the production apparatus of this embodiment.

First, in the wafer cassette 3 in the vacuum load/unload chamber 1 is held a wafer 4 that has a photoresist film 21 of a predetermined pattern formed on the multilayer film 20 of the barrier metal structure as shown in FIG. 2(a).

The multilayer film 20 of the barrier metal structure is comprised of a barrier metal film 20A and an upper layer 20B that are continuously formed in a predetermined vacuum chamber without being exposed to the external open air.

That is, after the barrier metal layer 20A is formed in the predetermined vacuum chamber, the upper layer 20B of the multilayer film 20 is formed immediately thereafter in the vacuum chamber without permitting the wafer substrate to be exposed to the external open air.

The multilayer film 20 is formed in a continuous manner based on the discovery that the multilayer film 20 is reliably prevented from corroding by chlorine 23, remaining on the surface of the wafer 4, that diffuses along the boundary between the barrier metal layer 20A and the upper layer 20B in comparison with the multilayer film 20 obtained by forming the upper layer 20B on the barrier metal layer 20A after it is once exposed to the external open air.

In this case, the multilayer film 20 is continuously formed by the production apparatus and the production method of the aforementioned embodiment.

Therefore, the sputter chamber 10 according to this embodiment is capable of forming the multilayer film 20 in a continuous manner.

The wafer 4 held in the wafer cassette 3 in the vacuum load/unload chamber 1 is carried by carriage means 7 into the etching chamber 9 maintained under a vacuum condition through the partitioning valve 12 after having passed through the partitioning valve 5 and the vacuum carriage chamber 6, the vacuum carriage chamber 6 being maintained under a vacuum condition.

The etching chamber 9 into which the wafer 4 is carried is maintained under a predetermined vacuum degree, and a chlorine-type reaction gas such as $BCl_3 + Cl_2$ is introduced therein to effect reactive ion etching in order to form a predetermined wiring pattern of the multilayer film 20 on the wafer 4.

During the etching, chlorine 23 in the chlorine-type reaction gas is adsorbed by the surface of the wafer 4 and stays therein as shown in FIG. 2(b).

Figure 2C:
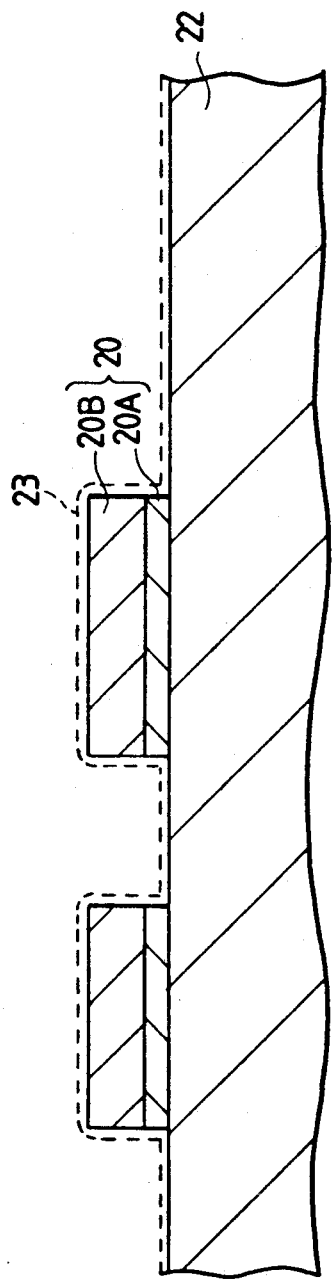
Figure 2D:
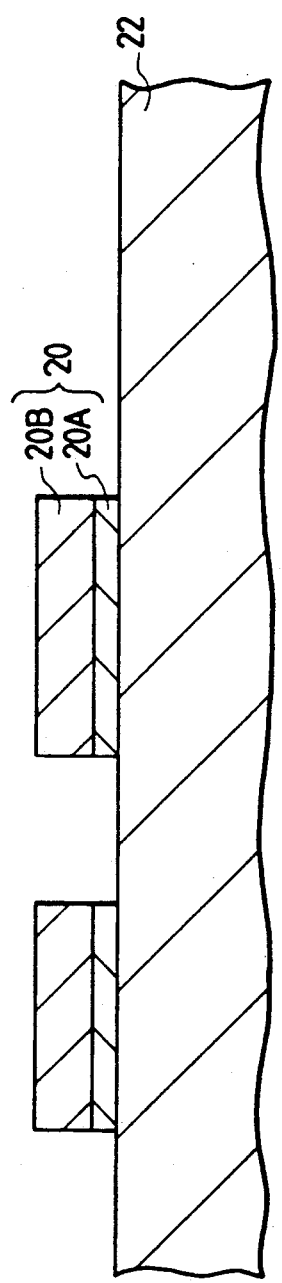

Then, after the chlorine-type reaction gas for the etching is forcibly evacuated, a mixture gas of FREON (trademark, i.e., $CF_4) + O_2$ is introduced into the etching chamber 9 to effect the plasma discharge, and the photoresist film 21 is removed by the ashing method as shown in FIG. 2(c).

Even after the photoresist film 21 is removed, chlorine 23 in the chlorine-type reaction gas at the time of etching remains on the surface of the wafer 4 as shown in FIG. 2(c), and there also newly remains thereon any chlorine in the mixture gas, i.e., $CF_4 + O_2$, at the time or removing the photoresist film 21.

Then, the wafer 4 in the etching chamber 9 is carried by carriage means 7 into the vacuum load lock chamber 8 maintained under a vacuum condition via the partitioning valve 11, after having passed through the partitioning valve 12 and the vacuum carriage chamber 6 maintained under the vacuum condition.

After the partitioning valve 11 is closed, the vacuum load lock chamber 8 into which the wafer 4 is carried is vented with an inert gas such as argon.

Then, the wafer 4 is carried by the predetermined carriage means to the wet processing chamber 15 via the partitioning valve 16.

At this moment, the interior of the wet processing chamber 15 is purged with an inert gas such as nitrogen maintaining a pressure equal to or greater than atmospheric pressure.

The wafer 4 is washed with water by the washing unit 15A and, then, chlorine remaining in the wafer 4 is removed in an atmosphere in the wet processing chamber 15 that is maintained under a pressure equal to or greater than atmospheric pressure and that is shut off from the external open air. Thereafter, the adhered water is removed from the wafer by centrifugal force produced by the revolution of the spinner in the drying unit 15B.

Then, the wafer 4 is carried by the predetermined carriage means into the vacuum lock chamber 8 which is then evacuated.

At this moment, the wafer 4 is heated and dried by the heating means 14 in vacuum, and water remaining on the wafer 4 is reliably removed.

Thereafter, the wafer 4 in the vacuum load lock chamber 8 is carried by carriage means 7 into the vacuum load/unload chamber 1 through the partitioning valve 11, vacuum carriage chamber 6 maintained under the vacuum condition and partitioning valve 5, and is held in the wafer cassette 3 to complete a series of processing steps.

According to the production apparatus of the embodiment as described above, there are provided (1) the etching chamber 9 for dry-processing the wafer 4, (2) the wet processing chamber 15 for wet-processing the wafer 4, (3) the vacuum carriage chamber having a carriage means for transferring the wafer 4 between different chambers, and (4) the vacuum load lock chamber 8 between the sputter chamber 10 and the wet processing chamber 15. Therefore, reduced space is required by the apparatus which effects the step of dry-etching the wafer and which also effects the succeeding step of wet processing. Furthermore, the dry processing step and the wet processing step that are continuously carried out help improve the operation efficiency.

According to the production apparatus and production method of the aforementioned embodiment, furthermore, the wafer 4 is carried into the wet processing chamber 15 where it is washed and dried without exposing the wafer to the open air outside the production apparatus, i.e., without brining the wafer into contact with water suspended in the external open air during the dry processing of the wafer 4 (etching of wafer 4 and removal of the photoresists film 21) in the etching chamber 9 and even after the above processing. Thereafter, the wafer 4 is carried into the vacuum load lock chamber 8 where it is heated and dried.

After the dry processing step in the etching chamber 9 and before the washing step in the wet processing chamber 15, therefore, the multilayer film 20 is reliably prevented from being corroded by the reaction of water suspended in he external open air with chlorine remaining in the wafer 4, i.e., with chlorine 23 remaining in the wafer 4 due to the absorption of the reaction gas such as $BCl_3 + Cl_2$ at the time of etching and a mixture gas such as FREON (trademark) $+ O_2$ at the time of removing the photoresist film 21.

In a multilayer film of a barrier metal structure corresponding to the multilayer film 20 of the present invention, chlorine 23 remaining on the surface of the wafer may diffuse along the boundary between the barrier metal layer and the upper layer to corrode the multilayer film. According to the present embodiment, however, the corrosion caused by the factors specific to such a multilayer structure is reliably prevented. Moreover, the present embodiment is best adapted to the dry etching method for the barrier metal structures that tend to develop corrosion.

In the foregoing was concretely described the invention accomplished by the present inventors, by way of embodiment. However, it need not be pointed out that the present invention is in no way limited to the above embodiment only, but can be variously modified without departing from the gist thereof.

For example, the present invention can also be adapted to chemical vapor deposition (CVD) processing, through the above embodiment was adapted to the sputtering and dry etching steps. Illustratively, and not limiting, a preferred vacuum condition for the CVD process, for depositing a metal, is in the range of $1 \times 10^{-6}$ to $1 \times 10^{-9}$ Torr.

In the above embodiment, furthermore, the heating mechanism 14 is provided in the vacuum lock load chamber 14. According to the present invention, however, the heating means 14 may be provided in the wet processing chamber 15.

Simply described below are the effects obtained by a representative example among the inventions disclosed in this embodiment.

That is, the dry processing step, wet processing step and carriage stp for the wafers are continuously carried out in a predetermined (controlled) atmosphere in the processing apparatus shutting off the external air, making it possible to improve the operation efficiency in the dry processing step and in the wet processing step for the wafers. Furthermore, it is possible to reliably prevent the wafers from becoming defective due to reaction with the external air, i.e., to reliably prevent the formation of a spontaneously oxidized film and corrosion on the wafers.

Furthermore, the apparatus for producing semiconductor devices of the present invention incorporates a dry processing mechanism, wet processing mechanism and carriage mechanism for the wafers, contributing to reducing space required by the apparatus which effects the wafer dry processing step and the wet processing step, and, further, making it possible to improve the operation efficiency. Furthermore, since the above-mentioned mechanisms have been shut off from the external air, the wafers are reliably prevented from becoming defective due to reaction with the external air.

EMBODIMENT 2

Described below is a method of producing a monolithic integrated circuit chip that corresponds to a bipolar IC, according to another embodiment of the present invention.

In the following description of the structure, components, in different drawing figures, denoted by reference numerals, the last two digits of which are the same, are the same components or have the same functions unless otherwise stated, and are not described again with respect to the later drawing figures.

Figure 3:
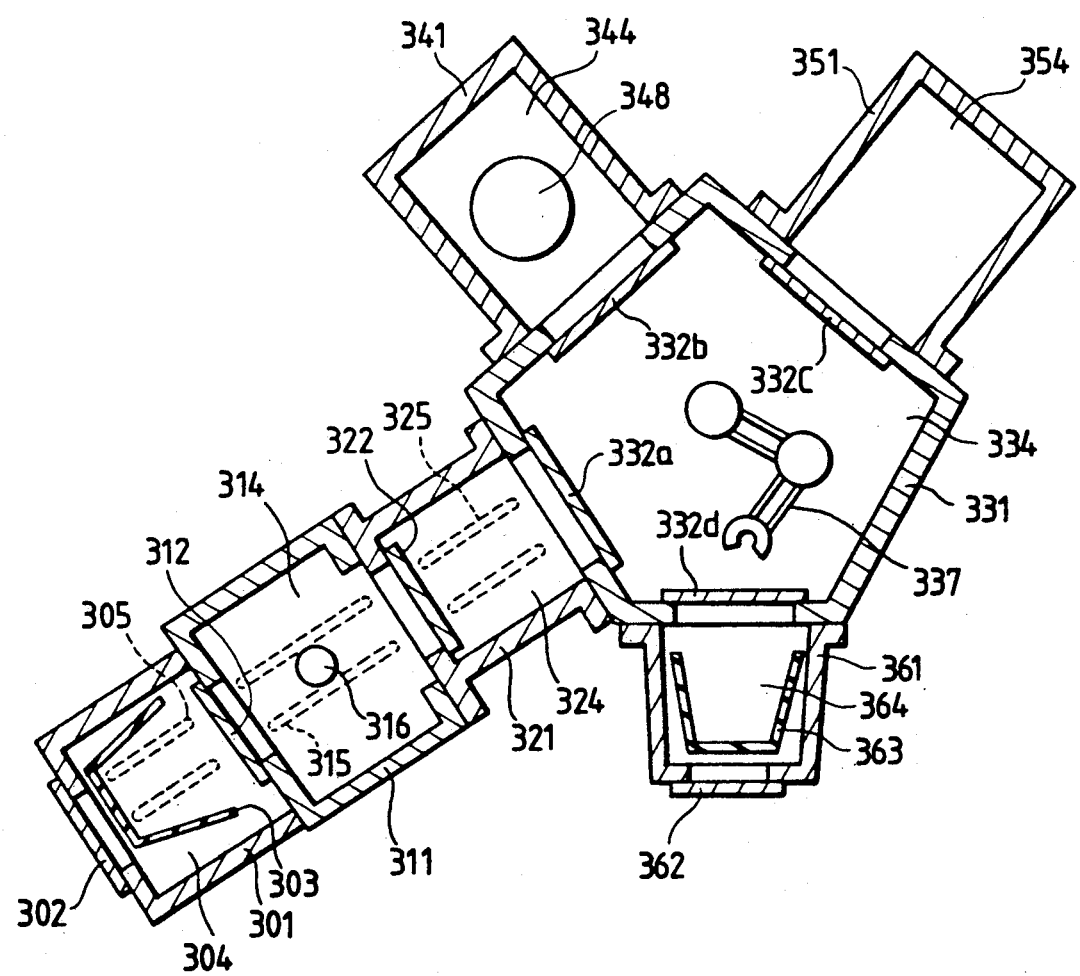
FIGS. 3 to 7 are horizontal sectional views schematically illustrating various continuous processing apparatuses according to a second embodiment of the present invention.

FIG. 3 is a horizontal sectional view which schematically illustrates a continuous processing apparatus for platinum sputtering processing, and wherein reference number 301 denotes a wafer load unit block which loads the wafers with the cassette as a unit and which substitutes the internal atmosphere with a purge gas such as nitrogen, 302 denotes an opening-closing door for inserting an taking out the cassettes and which is so designated as to maintain an internal vacuum condition, 303 denotes a wafer cassette for holding the wafers with a lot as a unit, 304 denotes a wafer load chamber, and 305 denotes a carriage belt for carrying the wafers piece by piece.

Reference numeral 311 denotes a pre-washing unit block for effecting pre-treatment for platinum sputtering, 312 denotes an opening/closing door which is the same as the aforementioned one, 314 denotes a pre-washing chamber, 315 denotes a carriage belt, and reference number 316 denotes a spinner which uses suction to hold the back surfaces of the wafers to be processed to support the wafers while revolving them at high speeds.

Reference numeral 321 denotes a load lock and vacuum bake unit block in which the wafers are heated at 200° C. to 600° C. by a lamp (not shown) and the water is completely removed from the wafers under a vacuum condition. Reference numeral 322 denotes an opening/closing door, 324 denotes a load lock or vacuum bake chamber, and 325 denotes a carriage belt.

Reference numeral 331 denotes a vacuum carriage unit block which carries the wafers among the chambers arranged along the periphery, maintaining a vacuum condition. Reference numerals 332a to 332d denote opening/closing doors provided for the chambers, 334 denotes a vacuum carriage chamber, 337 denotes a robot arm which holds the wafer by the back surface thereof to transfer the wafer to any desired chamber.

Reference numeral 341 denotes a platinum sputtering unit block, 344 denotes a sputtering chamber thereof, and 348 denotes a wafer stage.

Reference numeral 351 denotes an oxygen anneal unit bock which effects oxygen annealing of the wafers on which platinum has been deposited, and 354 denotes an oxygen anneal chamber. The wafers to be treated are heated at 450° C. to 650° C. on a hot plate.

Reference numeral 361 denotes an unload unit block which discharges the treated wafers into the open air in a batchwise manner, 362 denotes an opening/closing door, 362 denotes a wafer cassette, and 364 denotes a load lock chamber for unloading.

In FIG. 3, as well as in FIGS. 4–7, the opening of the load and unload (or load/unload) unit blocks (e.g., in FIG. 3 load unit block 301 and unload unit block 361) to the outside (e.g., the openings, in FIG. 3, covered by opening/closing doors 302 and 362) are larger (wider and longer) than cassettes 3 so that the cassettes, with wafers, can be supplied to or removed from the load and unload unit blocks through the openings.

Figure 4:
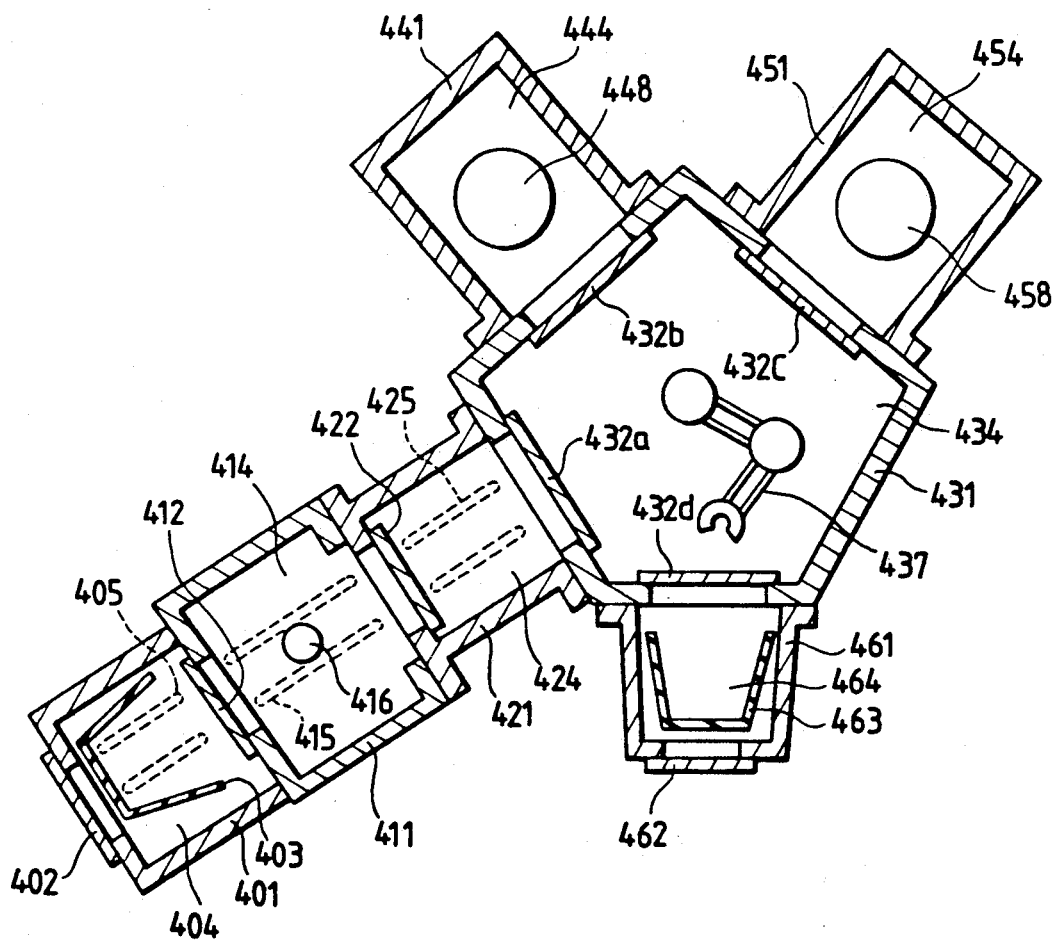

FIG. 4 is a horizontal sectional view which schematically illustrates an apparatus for depositing mutual metal wirings, wherein reference numeral 401 denotes a load lock unit block (for loading) like load lock unit block 301 of FIG. 3, reference numeral 402 denotes an opening/closing door, 403 denotes a cassette, 404 denotes a load chamber, and 405 denotes a carriage belt. Reference numeral 411 denotes a spin etcher unit block which removes unnecessary portions of the platinum film by wet etching, and 414 denotes an etching chamber. This block effects the pre-processing of etching and washing with water. Reference numeral 421 denotes a vacuum bake furnace block having ah eating lamp, and 424 denotes a baking chamber. Reference numeral 431 denotes a vacuum carriage unit block, and 434 denotes a vacuum carriage chamber. Reference numeral 441 denotes a titanium-tungsten (TiW) sputtering unit block for depositing a first (underlying) metal layer that serves as a mutual wiring, and 444 denotes a sputtering chamber. Reference numeral 451 denotes an aluminum (Al) sputtering unit block for depositing a main metal layer of the mutual wiring, and 454 denotes an aluminum sputtering chamber. Reference numeral 461 denotes a combination load lock and unload unit block, and 464 denotes an unload chamber.

Figure 5:
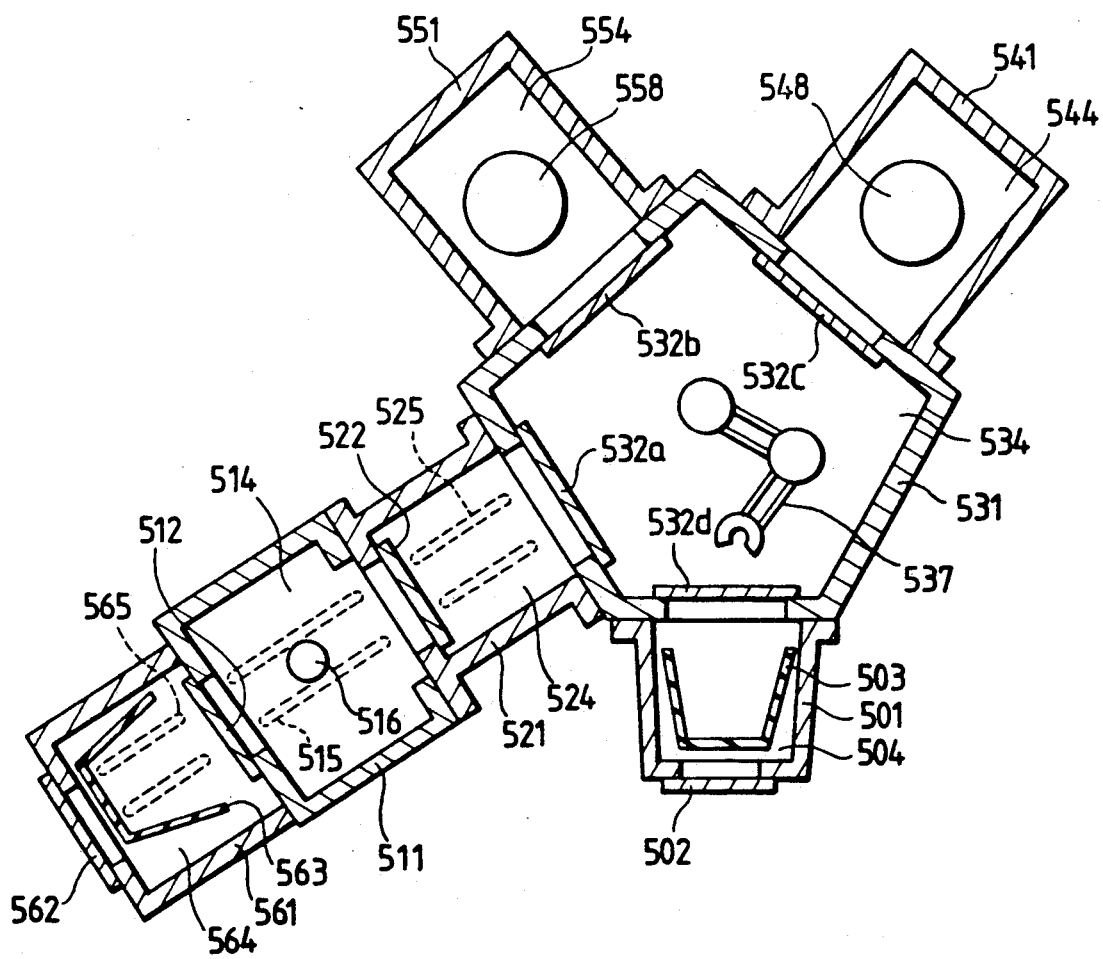

FIG. 5 is a horizontal sectional view which schematically illustrates a continuous processing apparatus that effects the patterning for the mutual wiring, wherein reference numeral 501 denotes a load lock unit block which effects the evacuation while loading, in a batchwise manner, the wafers to be treated that have a patterned photoresist on the main surfaces thereof, and 504 denotes a load lock chamber. Reference numeral 531 denotes a vacuum carriage unit block, and 434 denotes a vacuum carriage chamber. Reference numeral 541 denotes an aluminum dry etching unit block which cuts and patterns the aluminum layer and the underlying TiW layer, and 544 denotes an etching chamber. Reference numeral 551 denotes an oxygen plasma asher unit block which removes the resist film from the wafer after the aluminum dry etching, and 554 denotes an ashing processing chamber. Reference numeral 521 denotes a load lock unit block that transfers the wafer after the ashing processing to a next step, and 524 denotes a load lock chamber which receives the wafer under a vacuum condition and transfers it to a next step in an nitrogen gas atmosphere of, e.g., 1 atm. Reference number 511 denotes a spinner unit block that effects, in an nitrogen atmosphere, washing the wafer with water to remove chlorine that causes aluminum to corrode, and 514 denotes a wet processing chamber. Reference numeral 561 denotes an unload unit block and 564 denotes an unload chamber.

Figure 6:
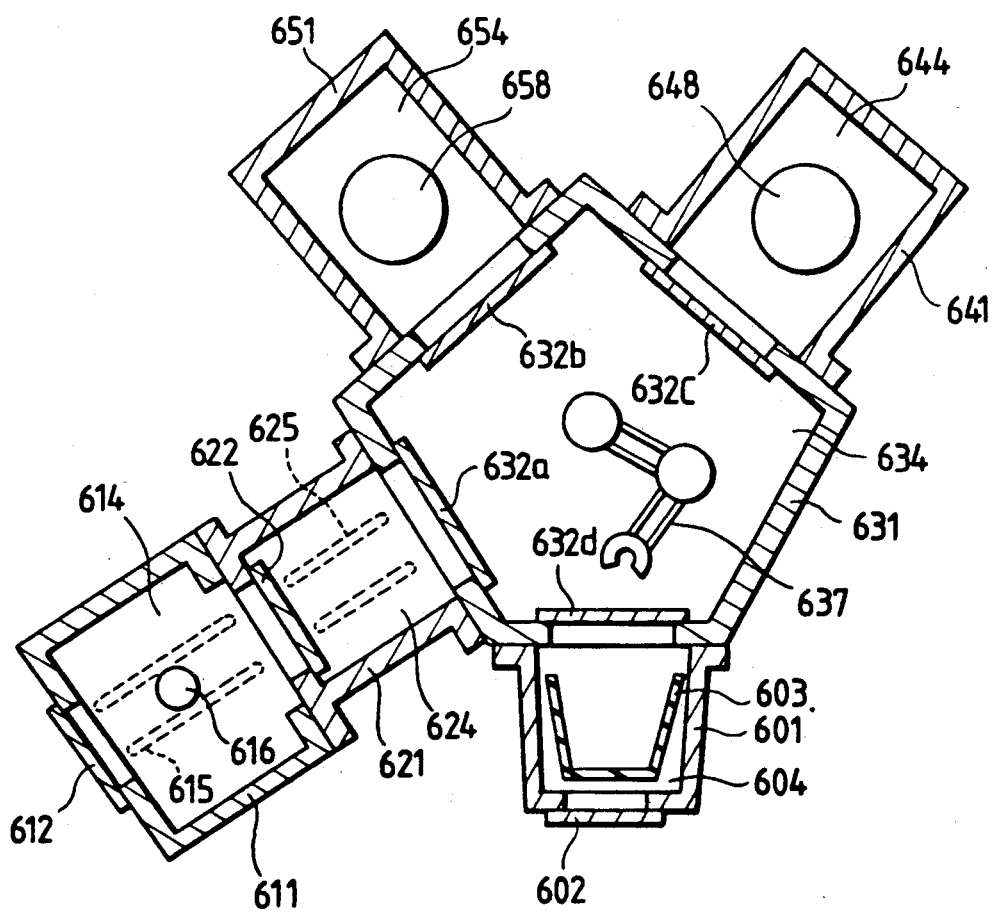

FIG. 6 is a horizontal sectional view which schematically illustrates apparatus for forming an insulating film in a continuous manner, that can be used for forming an interlay insulating film. Reference number 601 denotes a load lock and load/unload unit block, and 604 denotes a load lock chamber. Reference numeral 641 denotes a CVD (chemical vapor deposition) unit block for forming lower and upper $SiO_2$ film layers, and 644 denotes a reduced pressure processing chamber. Reference numeral 611 denotes an SOG (spin-on-glass) coater unit block for spin-coating the wafer on which the lower $SiO_2$ film layer is formed with an SOG (spin-on-glass) film, and 614 denotes a wet processing chamber. Reference numeral 621 denotes a load lock and bake unit block which is filled with nitrogen so as to provide therein a nitrogen atmosphere to couple the vacuum carriage chamber 634 and the SOG coating chamber 614 together, and which effects the baking after the coating, and 624 denotes a bake and load lock chamber. Reference numeral 651 denotes an etching back processing unit block which removes unnecessary portions of the SOG film on the wafer after it has been baked, and 654 denotes a gas phase processing chamber.

Figure 7:
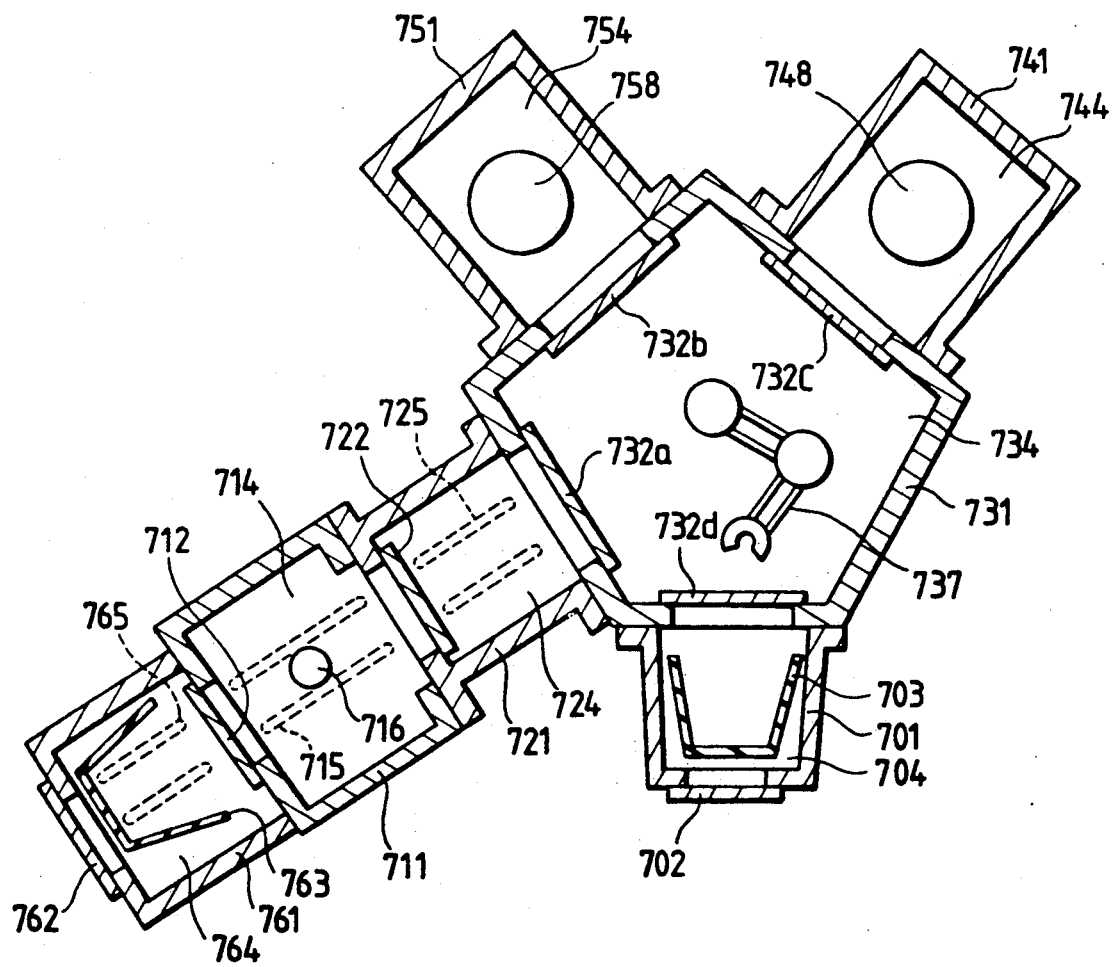

FIG. 7 is a horizontal sectional view which schematically illustrates a continuous etching processing apparatus that forms through-holes, wherein reference numeral 701 denotes a load unit block and 704 denotes a load lock chamber. Reference numeral 741 denotes an $SiO_2$ dry etching unit block that forms through-holes in the $SiO_2$ interlayer by dry etching, and 744 denotes a gas phase processing chamber. Reference numeral 751 denotes an oxygen asher unit block like that of FIG. 5. Reference numeral 721 denotes a load lock unit block which includes means to cause nitrogen to fill the chamber of the load lock unit block to had it over to the next step of wet processing maintaining a pressure equal to the atmospheric pressure, 711 denotes a spin etching unit block which removes the side film that is formed at the time of the dry etching, and 714 denotes a wet processing chamber. Reference numeral 761 denotes an unload unit block which discharges the treated wafers into the open air in a batchwise manner, 762 denotes an opening/closing door, 763 denotes a wafer cassette, 765 denotes a carriage (e.g., conveying) belt, and 764 denotes a load lock chamber for unloading.

Described below in detail are principal processing apparatuses the constitute the blocks of the aforementioned continuous processing apparatus.

Figure 31:
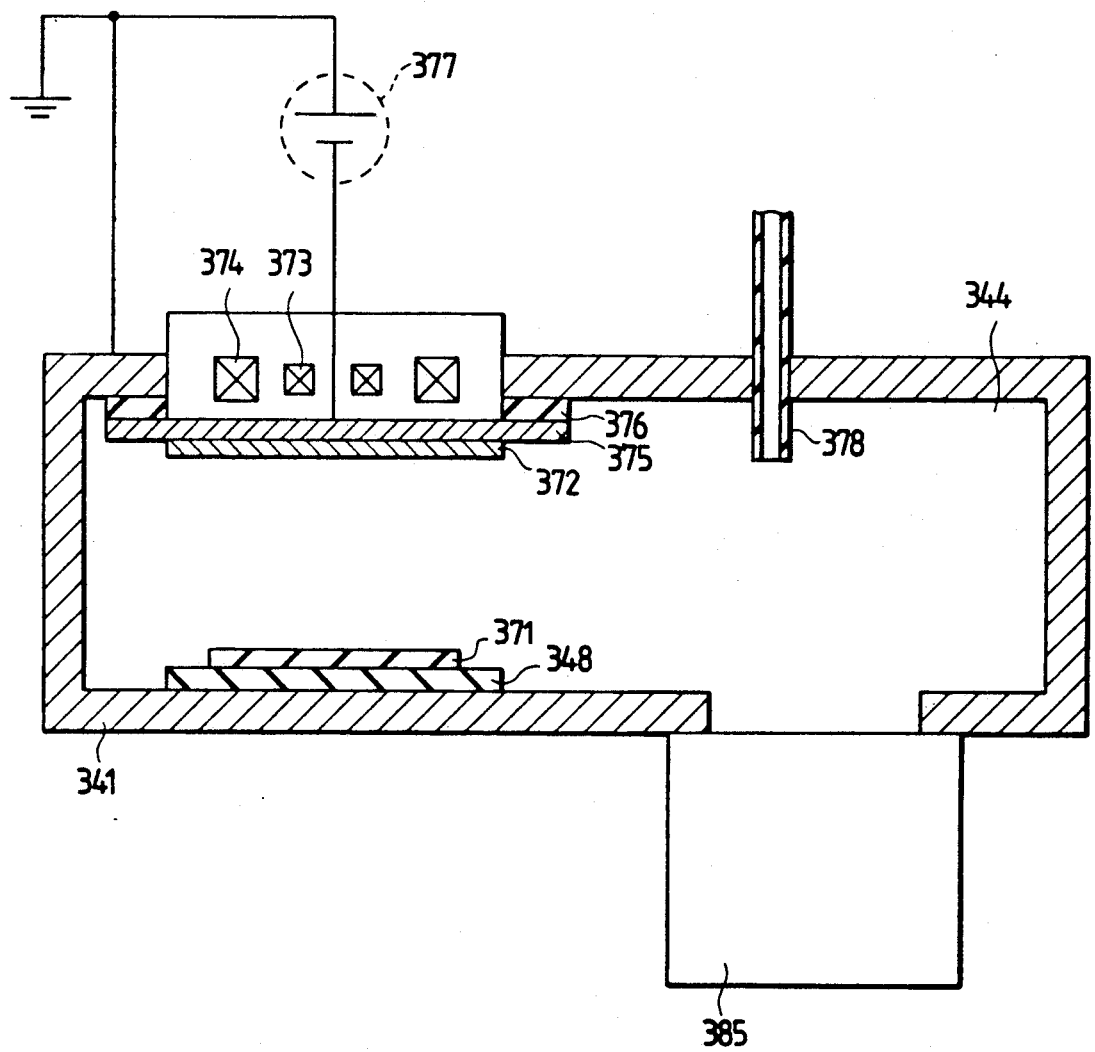
FIGS. 31 to 35 are schematic sectional views or internal front views of major unit processing apparatuses in the above-referred-to continuous processing apparatuses.

FIG. 31 is a front sectional view which schematically illustrates a magnetosputtering apparatus used to the sputtering deposition of Pt, TiW or Al, wherein reference numeral 341 denotes a metal container, 344 denotes a pressure reducing chamber, 348 denotes a wafer stage made of quartz, 371 denotes a wafer to be processed, 372 denotes a sputtering target, 373 denotes an inner magnet, 374 denotes an outer magnet, 375 denotes a backing plate (cathode), 376 denotes an insulating member for holding the backing plate, 377 denotes a DC bias power source, 378 denotes an argon gas nozzle, and 385 denotes a vacuum exhaust system.

Figure 32:
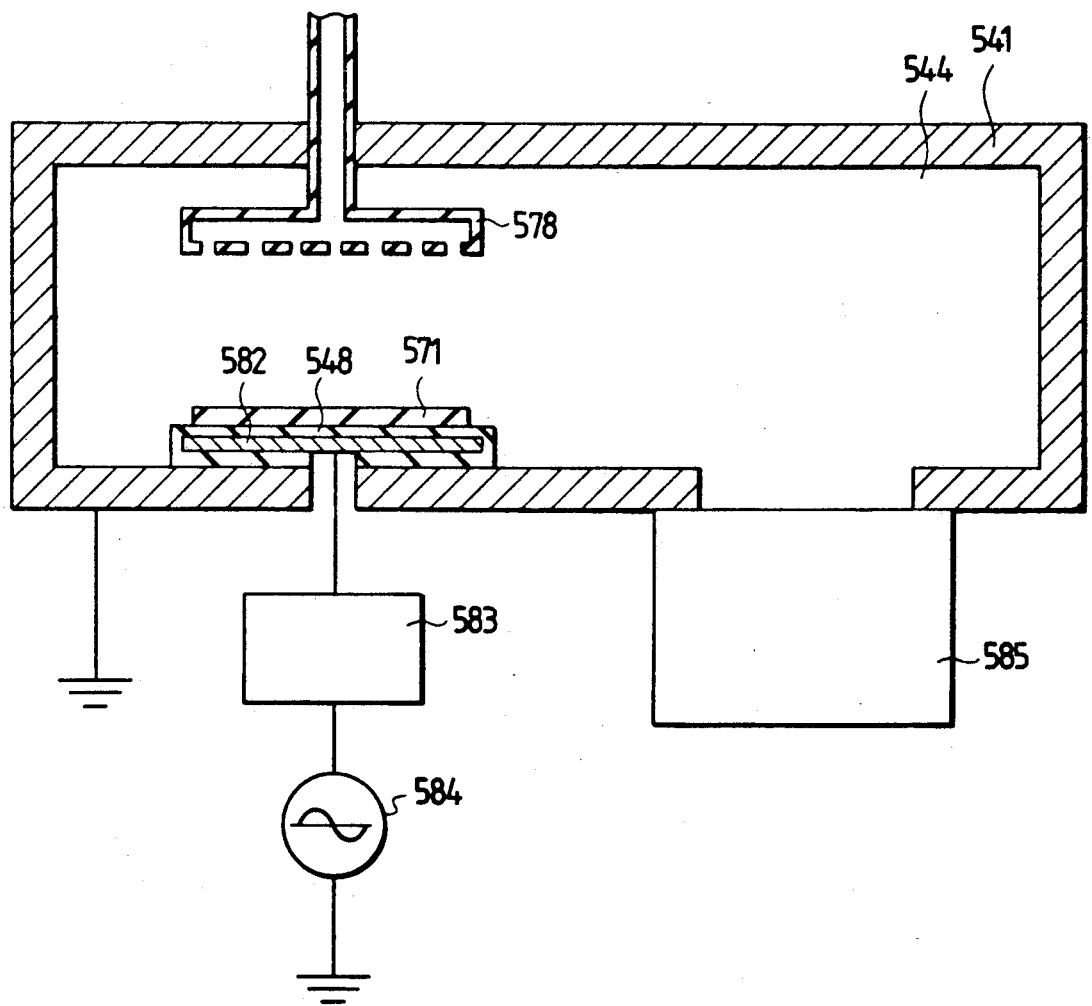

FIG. 32 illustrates an isotropic dry etching apparatus which effects dry etching for the first and second aluminum layers, which forms through-holes in the interlayer insulating film, and which forms pad openings for the final passivation, wherein reference numeral 541 denotes a pressure reducing chamber, 544 denotes a plasma processing chamber, 548 denotes an insulated wafer stage made of a ceramic, 571 denotes a wafer to be processed, 578 denotes a reaction gas supply nozzle, 582 denotes an electrode plate of the wafer side, 583 denotes a matching box (as conventionally used in anisotropic dry etching apparatus), 584 denotes a high frequency power source, and reference numeral 585 denotes a vacuum exhaust system.

Figure 33:
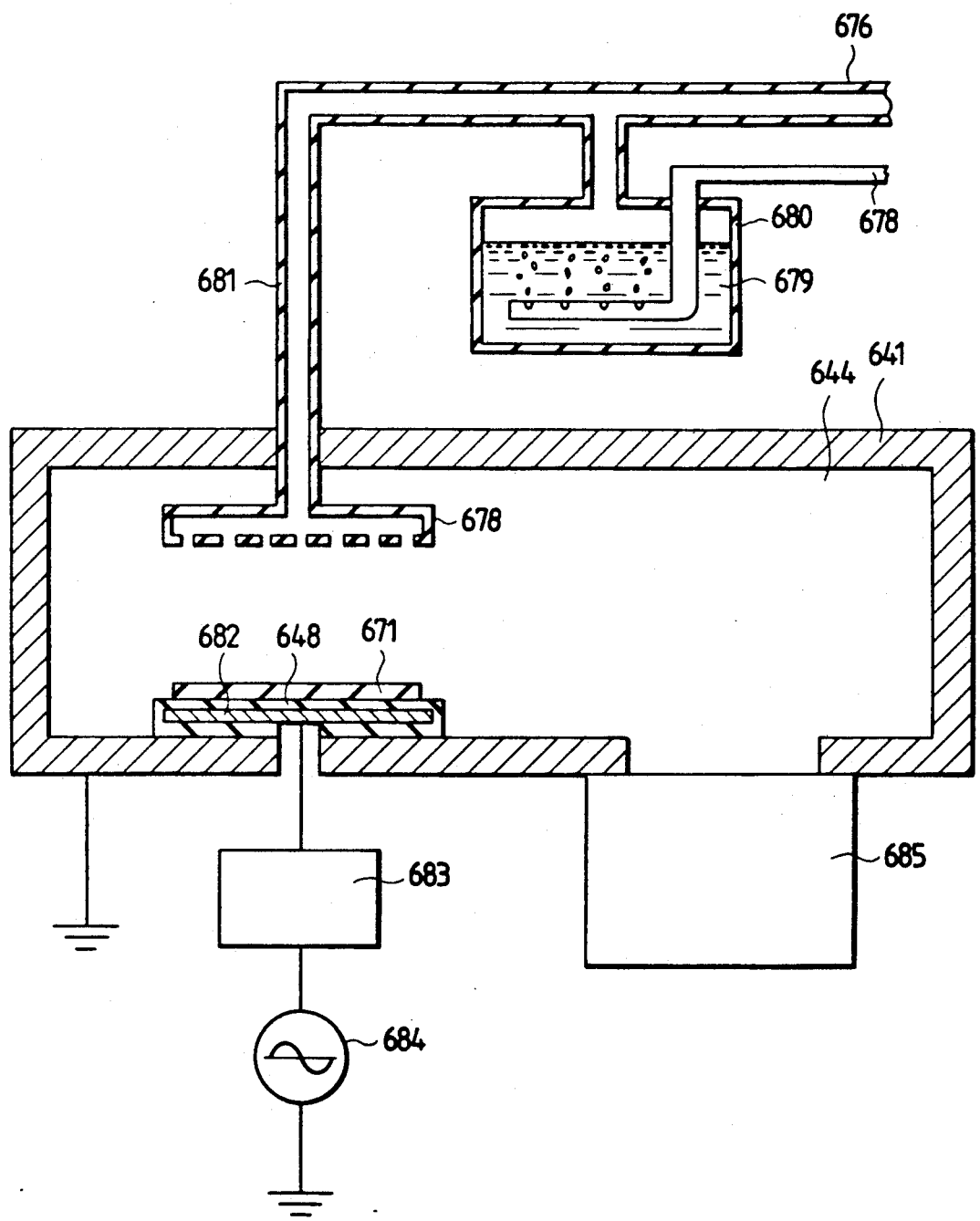

FIG. 33 shows a plasma CVD apparatus for forming the lower and upper CVD $SiO_2$ film layers of the interlay insulating film and the final passivation film, and wherein reference numeral 641 denotes a pressure reducing metal container, 644 denotes a gas phase reaction chamber, 648 denotes a wafer stage made of a ceramic, 671 denotes a wafer to be processed, 679 denotes a TEOS liquid source (tetraethoxysilane; $Si(OC_2H_5)_4$), 676 denotes an oxygen gas supply pipe, 678 denotes a reaction gas supply nozzle, 680 denotes a helium bubbler, 681 denotes a reaction gas supply pipe, 678 denotes a helium supply pipe, 682 denotes an electrode plate of the wafer side, 683 denotes a matching box (as conventionally used in plasma CVD apparatus), 684 denotes a high frequency power source, and reference numeral 685 denotes a vacuum exhaust system.

Figure 34:
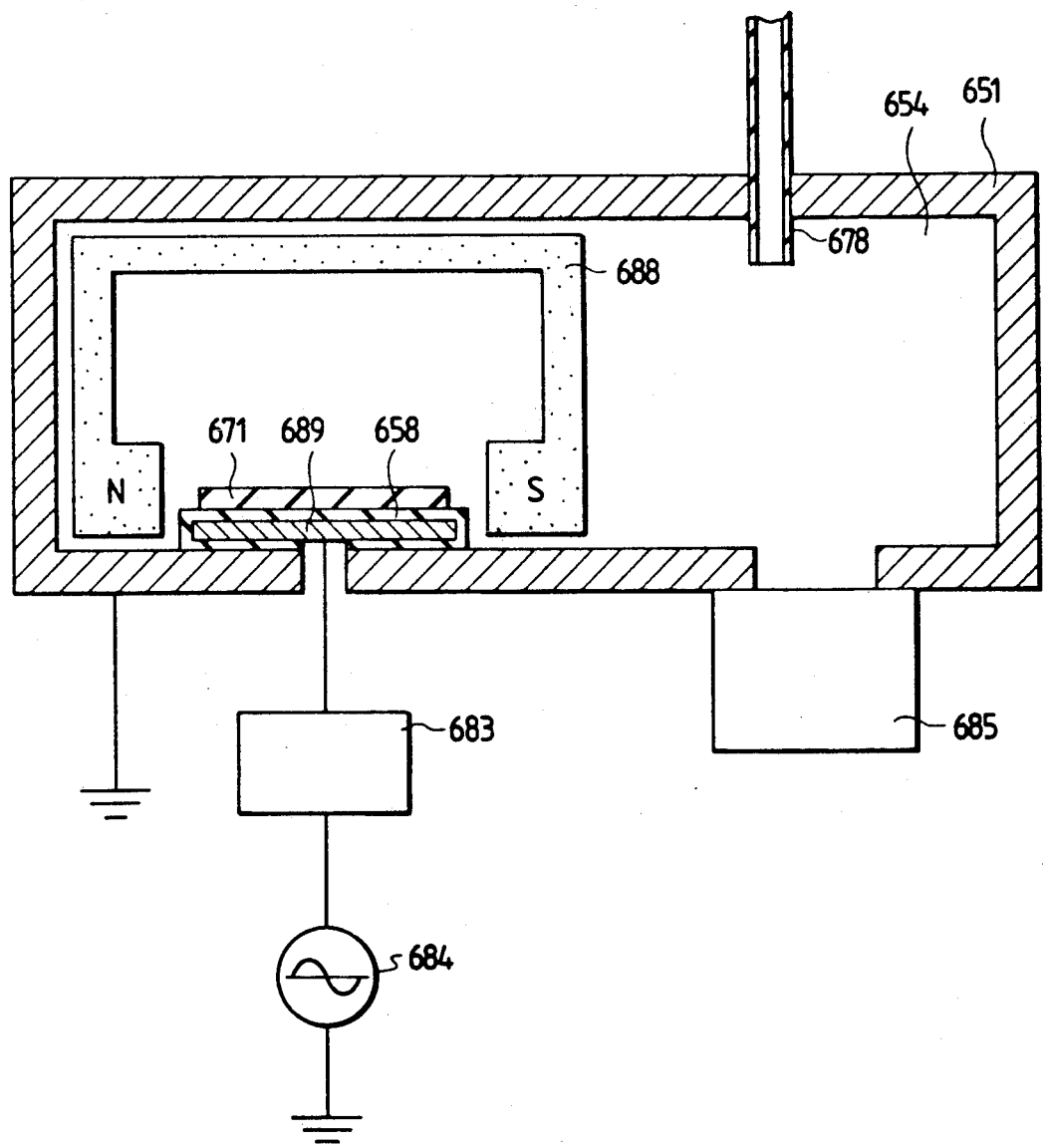

FIG. 34 illustrates a gas phase etching apparatus for subjecting the coated SOG film to the etching back processing, and wherein reference numeral 651 denotes a pressure reducing metal container, 654 denotes a pressure reducing chamber, 658 denotes a wafer stage made of a ceramic, 671 denotes a wafer to be processed, 678 denotes an argon gas supply nozzle, 688 denotes a magnet that establishes a horizontal magnetic filed on the wafer 671, reference numeral 689 denotes an electrode plate of the wafer side, 683 denotes a matching box (as conventionally used in gas phase etching apparatus), 684 denotes a high frequency power source, and reference numeral 685 denotes a vacuum exhaust system.

Figure 35:
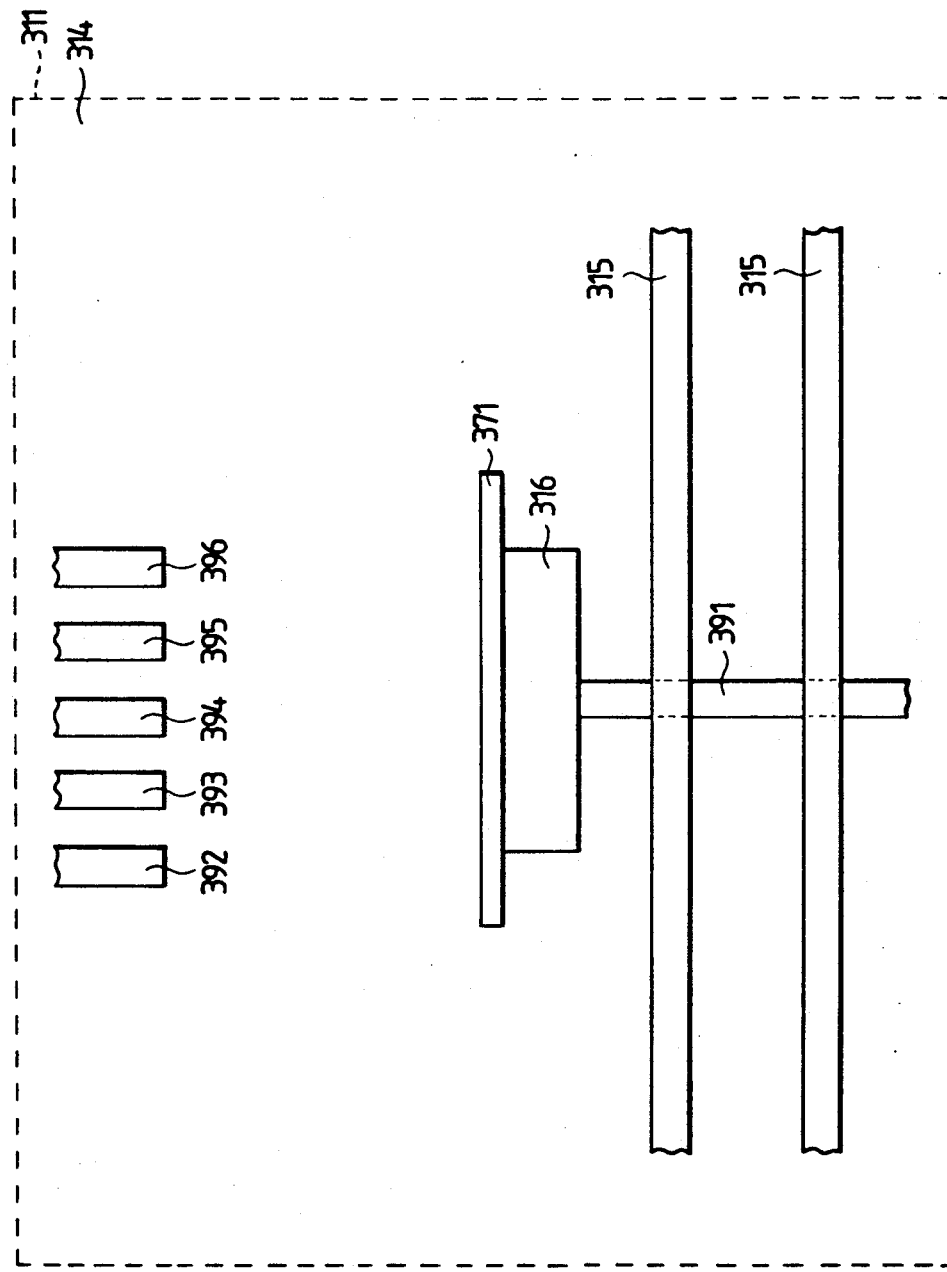

FIG. 35 shows a spinner for wet processing that effects washing with water, a variety of wet etchings and SOG coating, and wherein reference numeral 315 denotes a carriage belt, 316 denotes a spin stage that supports the wafer and holds the wafer thereon by suction, and revolves the wafer at high speeds, 371 denotes a wafer to be processed, 391 denotes a spindle, 392 denotes a gas supply nozzle, 393 denotes a pure water supply nozzle, 394 denotes an etching liquid supply nozzle, 395 denotes an SOG coating or dropping nozzle, 396 denotes a spare nozzle, and reference numeral 311 denotes a container that shuts the wet processing chamber 314 off from the open air.

Figure 36:
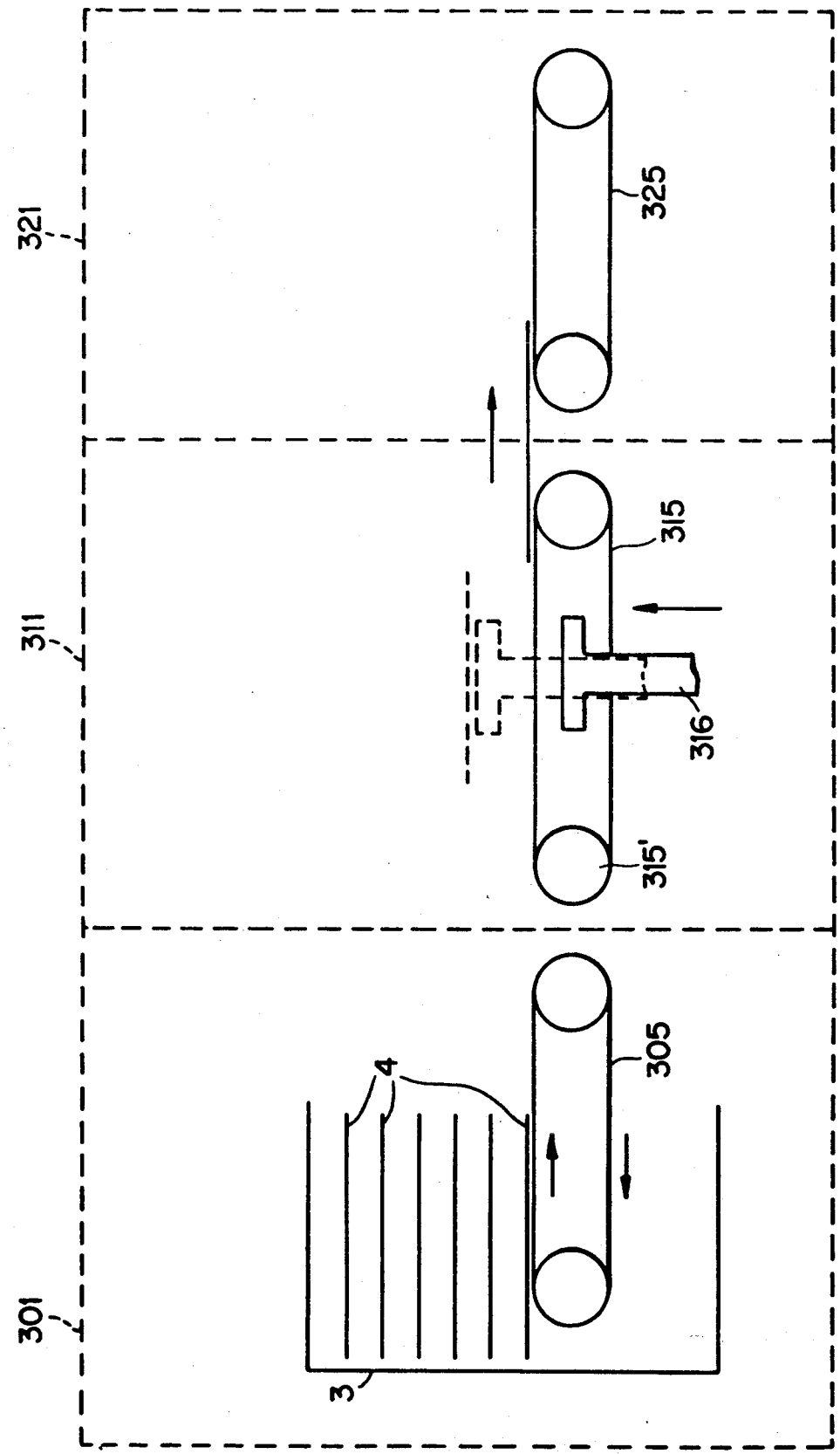
FIG. 36 is a schematic view for illustrating carrying means for transferring wafers between adjacent treatment chambers.

FIG. 36 shows carrying means for carrying wafers between adjacent treatment blocks. While FIG. 36 specifically shows conveying structure for conveying wafers (individually) from wafer load unit block 301 to pre-washing unit block 311 to load lock and vacuum bake unit block 321, shown in FIG. 3, corresponding conveying (carrying) means can be used for conveying wafers from load lock unit block 401 to spin etcher unit block 411 to vacuum bake furnace block 421, shown in FIG. 4; for conveying wafers from load lock unit block 521 to spinner unit block 511 to unload unit block 561, in FIG. 5; for conveying wafers between load lock and bake unit block 621 and spin-on-glass coater unit block 611, in FIG. 6; and for conveying wafers from load lock unit block 721 to spin etching unit block 711 to unload unit block 761, in FIG. 7. The disclosed carrying means is illustrative and not limiting.

In FIG. 36, the cassette 3 is shown with wafers 4 therein, in wafer load unit block 301. The wafers are conveyed through wafer load unit block 301 by, e.g., belt conveyor 305. The wafers transfer to conveyor belt 315, in pre-washing unit block 311. Drive rollers (note, e.g., drive roller 315') in unit block 311 drive the conveyor belt 315. Reference numeral 316 denotes the spin stage in pre-washing unit block 311. As can be appreciated from FIG. 36 and FIG. 3, the spin stage can be moved from a lowered position to a raised position so as to lift a wafer off the belt 315 for treatment and then reposition the wafer back on the belt (by lowering the spin stage) so that the wafer can be transferred to load lock and vacuum bake unit block 321. Reference numeral 325 represents the conveyor belt in load lock and vacuum bake unit block 321.

Figure 37:
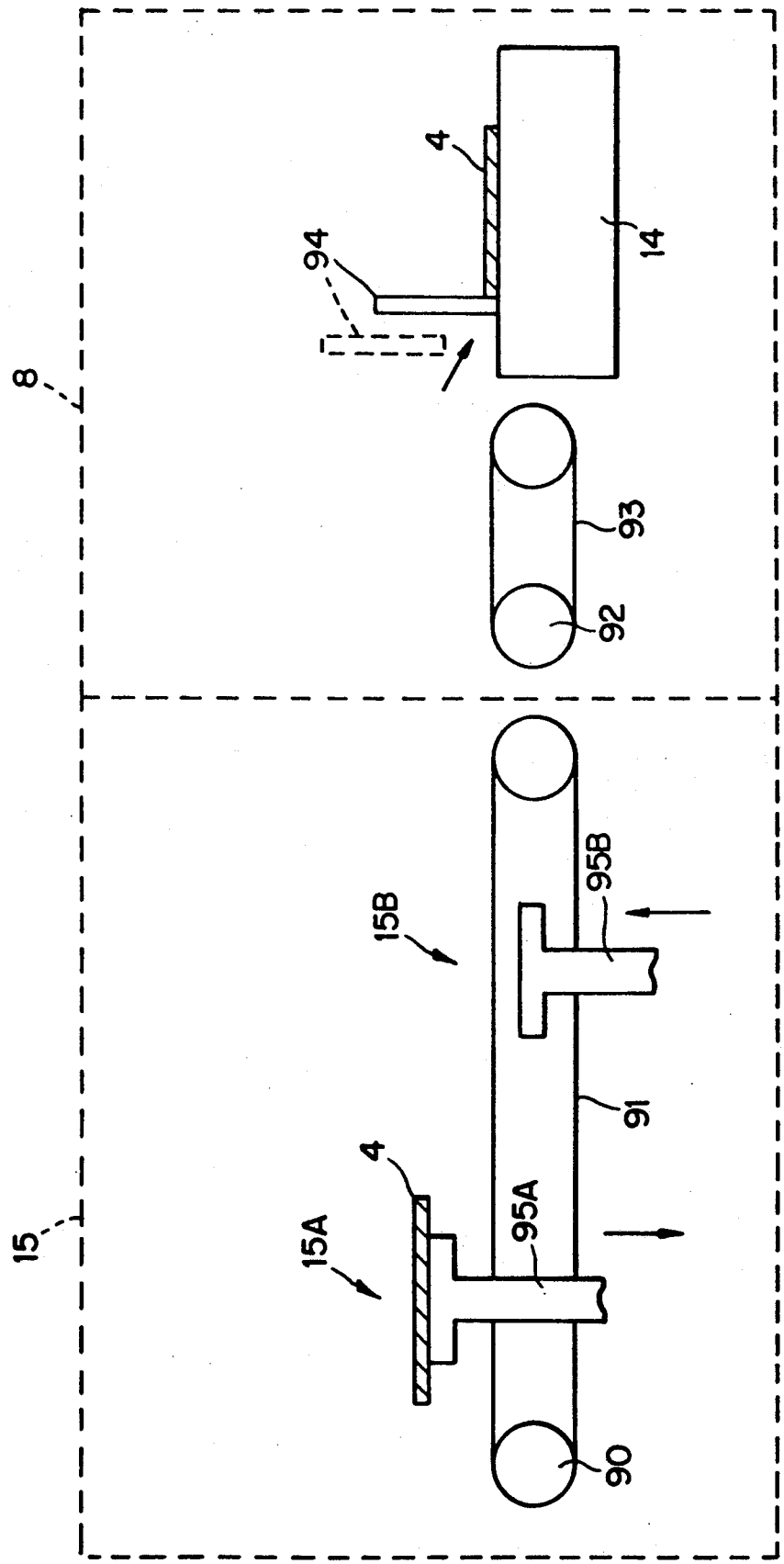
FIG. 37 is a schematic view for illustrating the washing and drying units of the wet processing chamber, as well as for illustrating carrying means for transferring wafers between the washing and drying units of the wet processing chamber and between the wet processing chamber and the vacuum load lock chamber.

FIG. 37 illustrates carrying means in wet processing chamber (wet processing mechanism) 15, and for transferring wafers between wet processing chamber 15 and vacuum load lock chamber 8. In FIG. 37, reference numeral 90 represents the drive roll for conveyor belt 91 carrying wafers 4, individually, in wet processing chamber 15. Shown in FIG. 37 are spin stages 95A and 95B respectively for washing unit 15A and drying unit 15B. The spin stages 95A and 95B can each be raised and lowered, independently, so as (1) to pick a wafer up from the conveyor belt 91 and support the wafer for treatment, and (2) to deposit the wafer back on the conveyor belt, respectively. As seen in FIG. 37, spin stage 95A is in a raised position, having a wafer supported thereby, while spin stage 95B is in a lowered position. The wafer 4 is transferred from wet processing chamber 15 to vacuum load lock chamber 8 via conveyor belt 91 and conveyor belt 93 (in chamber 8). Conveyor belt 93 is driven by drive roll 92, and carries the wafer to heating means 14. Reference numeral 94 represents a mechanical pusher for positioning a wafer 4 on the heating means 14. As seen in dotted and solid lines, the mechanical pusher is moved from a position where it does not interfere with movement of a wafer toward the heating means, to a position where it pushes the wafer to a predetermined position on the heating mean (e.g., hot plate) 14.

Described below in conjunction with FIGS. 8 to 30 is a process for producing a bipolar semiconductor integrated circuit device, as an example of the semiconductor device or the semiconductor integrated circuit device formed using apparatuses shown in FIGS. 3 to 7 and in FIGS. 31 to 35.

FIG. 8 illustrates a silicon wafer obtained by forming an $n^+$-type buried region 203 on the upper main surface of a p-type silicon single crystalline substrate 201, forming an n-type epitaxial region (layer) 202 on the whole surface thereof, dividing the new substrate or the above epitaxial region into a plurality of islands by the $p^+$-type isolations 204a and 204b, and then forming a $p^+$-type base diffusion (doped region 206, an $n^+$-type emitter diffusion (doped) region 208, and an $n^+$-type collector contact region 207. In FIG. 8, reference numerals 205a to 205d denote LOCOS (local oxidation structure) oxide films or lower passivation film layers formed by various modified systems known in the art. Reference numerals 209a to 209d denote spontaneously oxidized films having a thickness of about 20 to 40 angstroms on the surface of the silicon epitaxial layer.

FIG. 9 shows the wafer in which the spontaneously oxidized films 209a to 209c are removed by the wet processing apparatus 311 shown in FIG. 3 in order to expose a base opening 210a, an emitter opening 210b, and a collector opening 210c.

FIG. 10 shows the wafer having a platinum film 211 deposited on the whole surface of the wafer by the platinum sputtering apparatus 341 of FIG. 3 maintaining a thickness of 200 to 500 angstroms.

FIG. 11 shows the wafer in which silicide layers (PtSi) 212a to 212c are formed in the openings 210a to 210c by the oxygen annealing apparatus 351 of FIG. 3.

Figure 12:
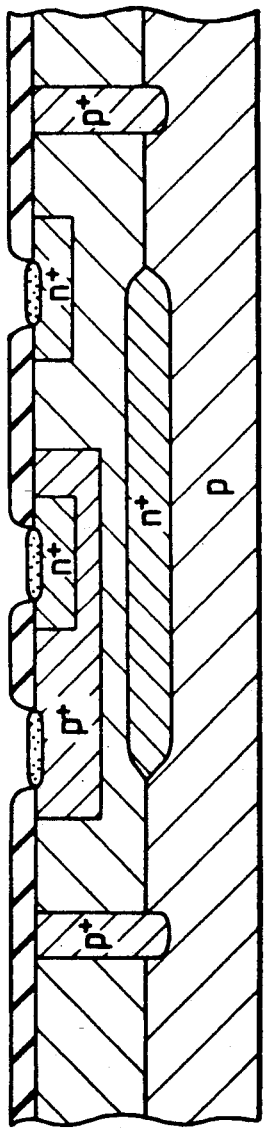

FIG. 12 shows the wafer from which unnecessary portions of the platinum film (e.g., portions of the platinum film which have not reacted with silicon in the openings 210a to 210c to form the silicide layers 212a to 212c) are removed by the wet etching apparatus of FIG. 4.

Figure 13:
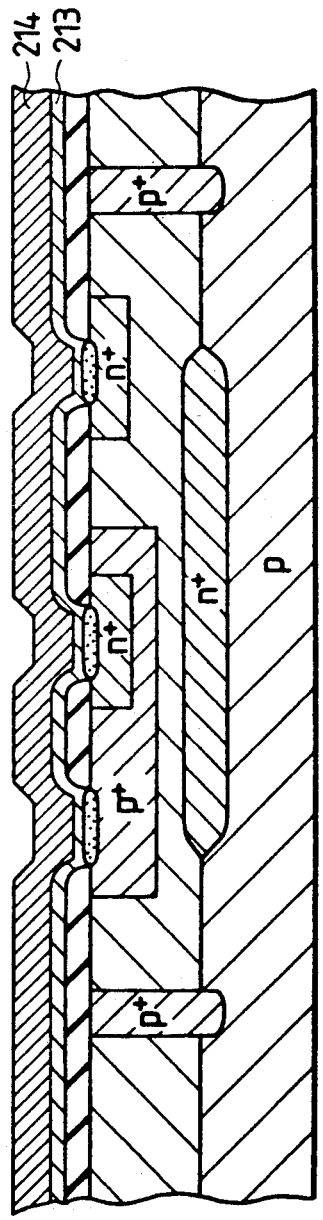

FIG. 13 shows the wafer on which is formed a TiW (titanium-tungsten) film 213 having a thickness of 200 to 1000 angstroms and an aluminum film (illustratively, 1% by weight of silicon, 3% by weight of copper and the remainder being aluminum) 214 having a thickness of 5000 to 10000 angstroms by the TiW sputtering apparatus 441 and the aluminum sputtering apparatus 451 shown in FIG. 4.

Figure 14:
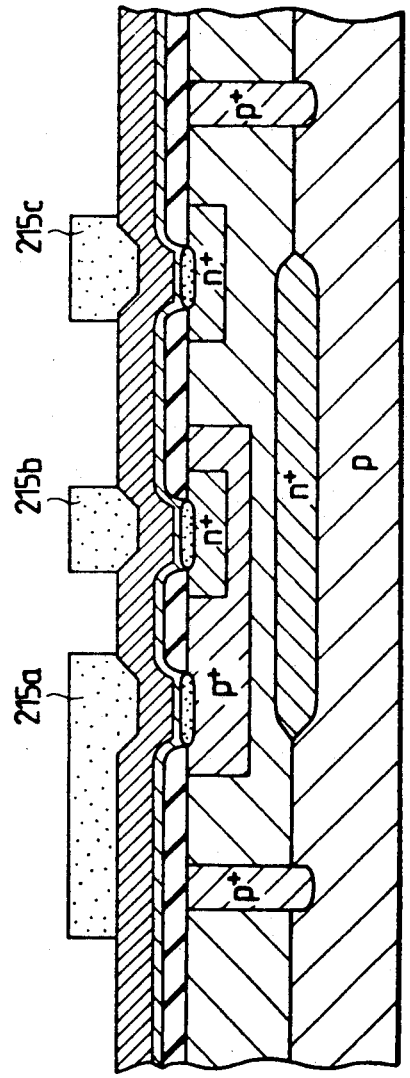

FIG. 14 shows the formation of photoresist patterns 215a to 215c for patterning the mutually connected wirings by photolithography.

Figure 15:
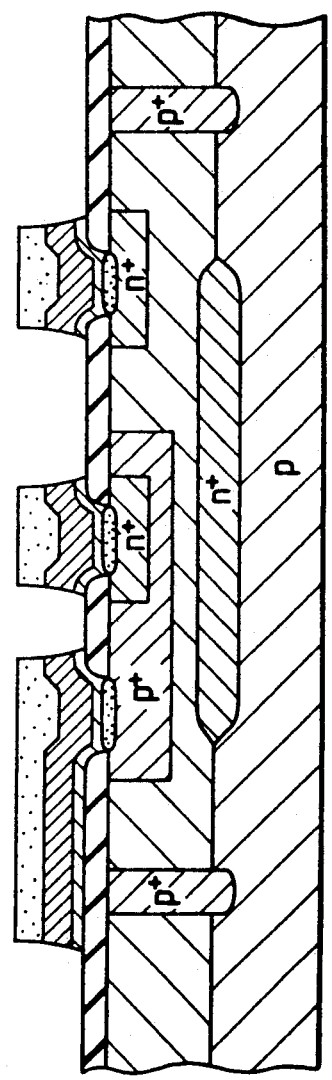

FIG. 15 shows the completion of patterning of the first mutually connected wiring layer using the aluminum etching apparatus 541 of FIG. 5 with the abovementioned photoresist pattern as a mask.

Figure 16:
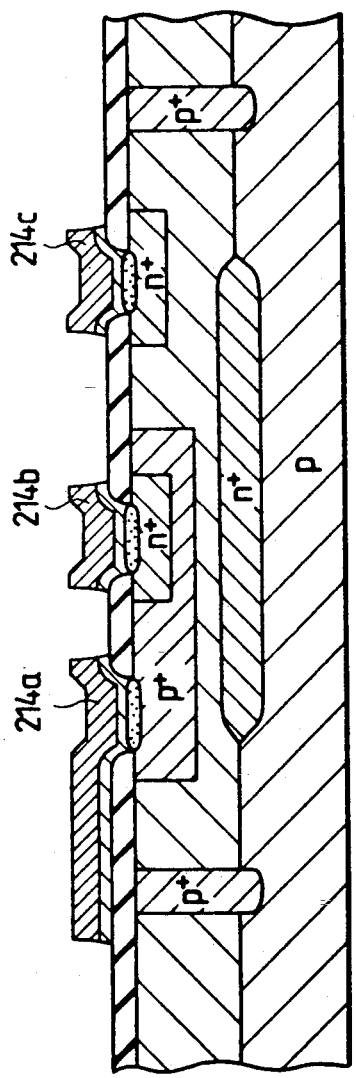

FIG. 16 shows the wafer from which the photoresist layer is removed by the oxygen asher 551 shown in FIG. 5, and wherein reference numerals 214a to 214c denote first aluminum wirings that are patterned.

Figure 17:
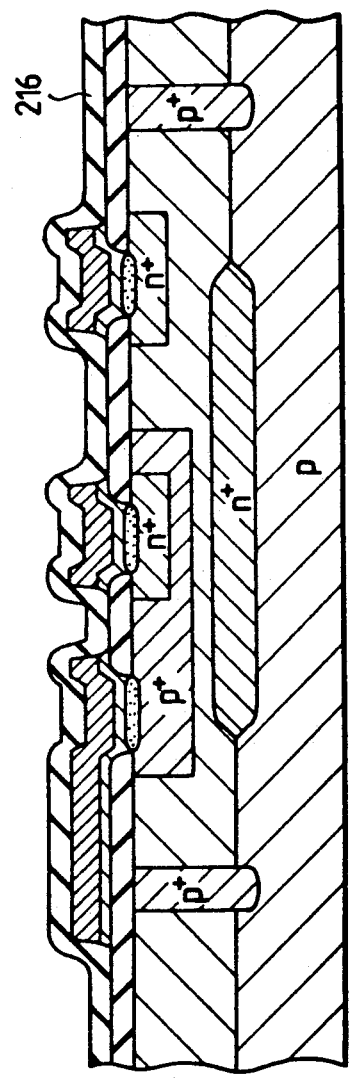

FIG. 17 shows the case when the $SiO_2$ film 216 under the interlayer insulating film is deposited by plasma CVD maintaining a thickness, illustratively, of 0.6 μm on the whole surface of the wafer, the $SiO_2$ film being deposited using the plasma CVD (chemical vapor deposition) apparatus 641 of FIG. 6.

Figure 18:
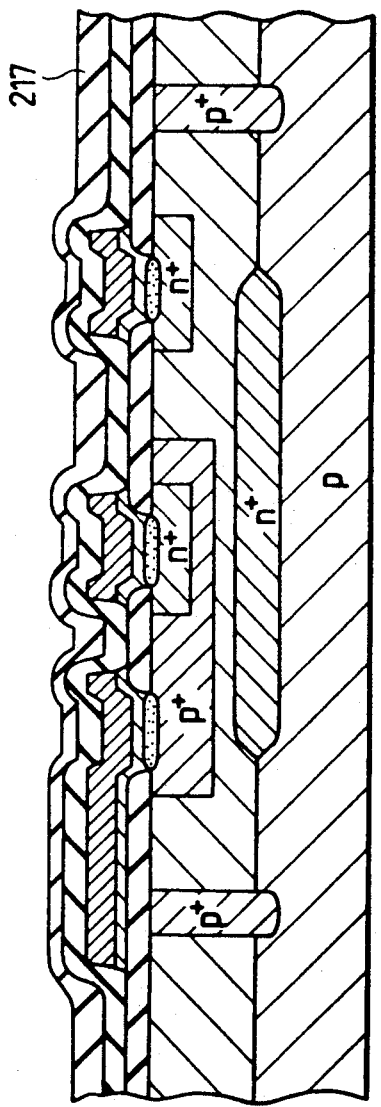

FIG. 18 shows the case when the main surface of the wafer is flattened by applying the SOG-SiO₂ film 217 by the SOG spinner 611 of FIG. 6.

Figure 19:
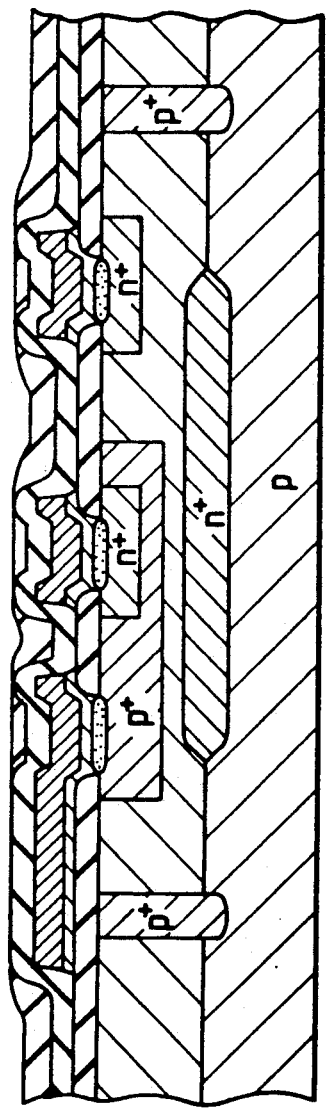

FIG. 19 shows the wafer from which unnecessary portions of the SOG film are removed uniformly by the dry etcher 651 for etching back shown in FIG. 6.

Figure 20:
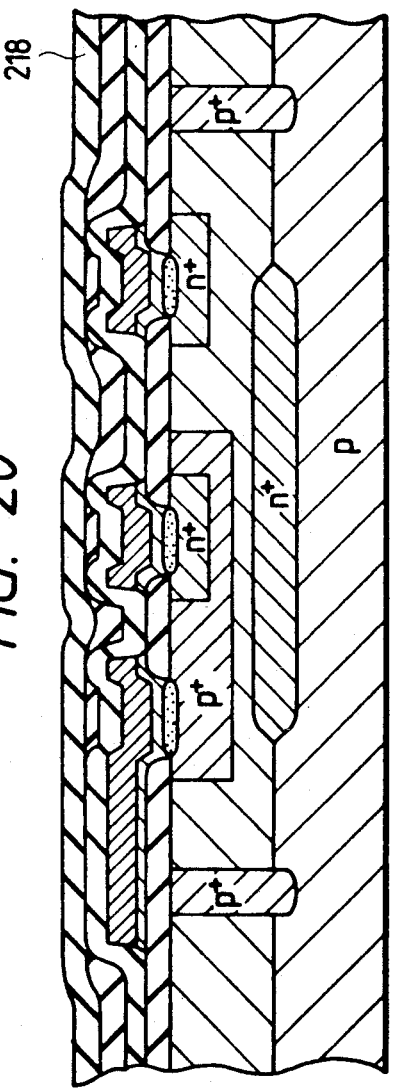

FIG. 20 shows the wafer having an SiO₂ film 218 deposited on the whole surface thereof, the SiO₂ film 218 maintaining a thickness of 0.6 μm and being deposited by the TEOS (tetraethylorthosilicate) method, like the above-mentioned case using the plasma CVD apparatus 641 of FIG. 6.

Figure 21:
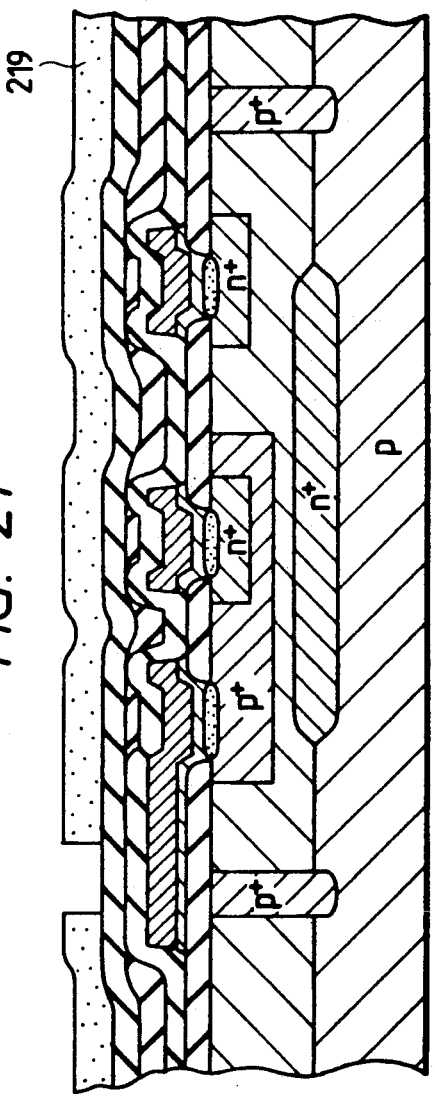

FIG. 21 shows the formation of a photoresist pattern 219, for forming through-holes by photolithography.

Figure 22:
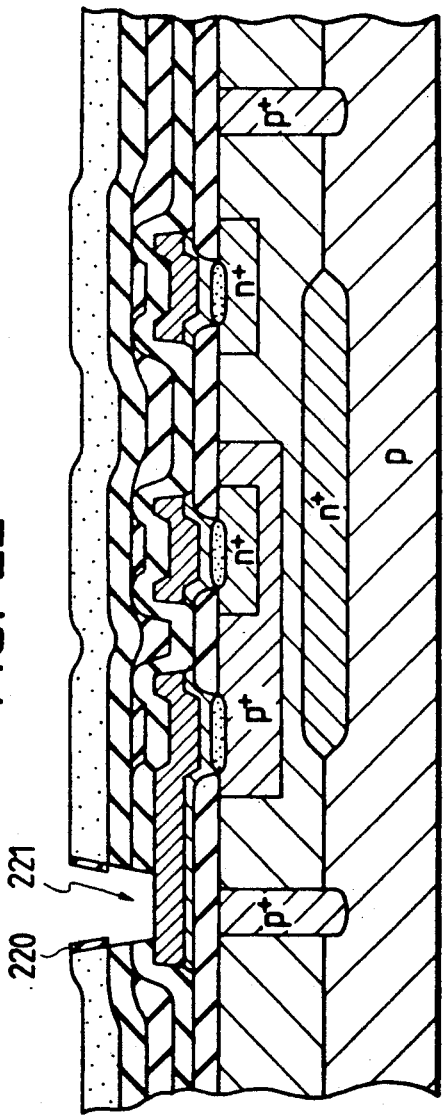

FIG. 22 shows the case where the through-hole 221 is opened using the dry etching apparatus 741 of FIG. 7 with the photoresist pattern 219 as a mask, and wherein reference numeral 220 denotes a side film formed during the dry etching.

Figure 23:
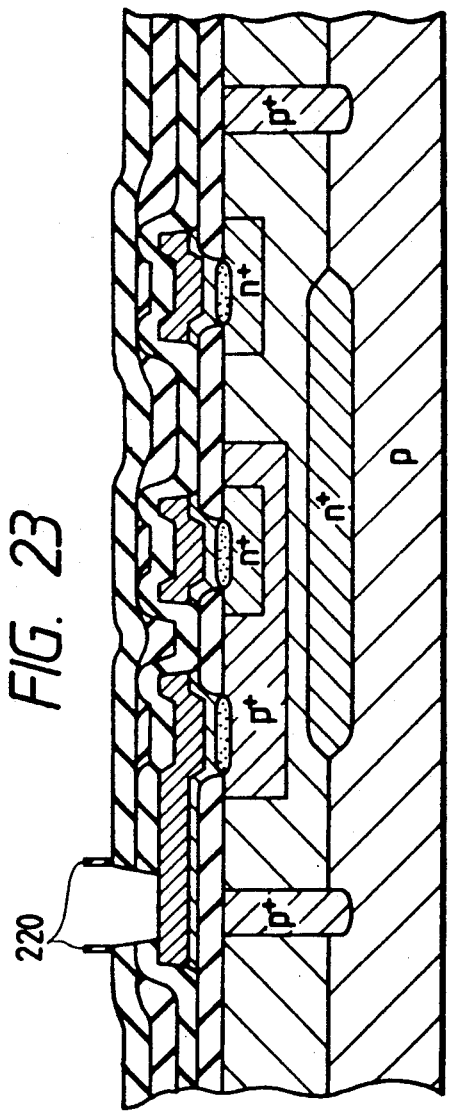

FIG. 23 shows the wafer from which the photoresist film is removed using the oxygen asher apparatus 751 of FIG. 7.

Figure 24:
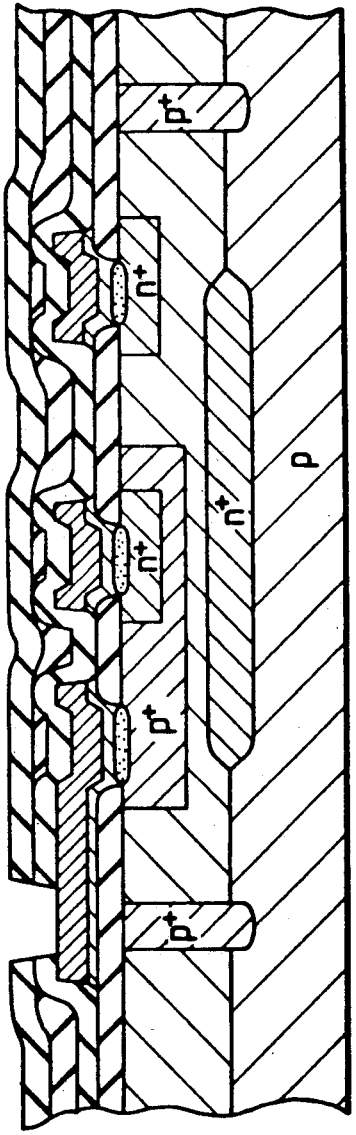

FIG. 24 shows the wafer from which the above-mentioned side film 220 is removed by the wet etching apparatus of FIG. 7.

Figure 25:
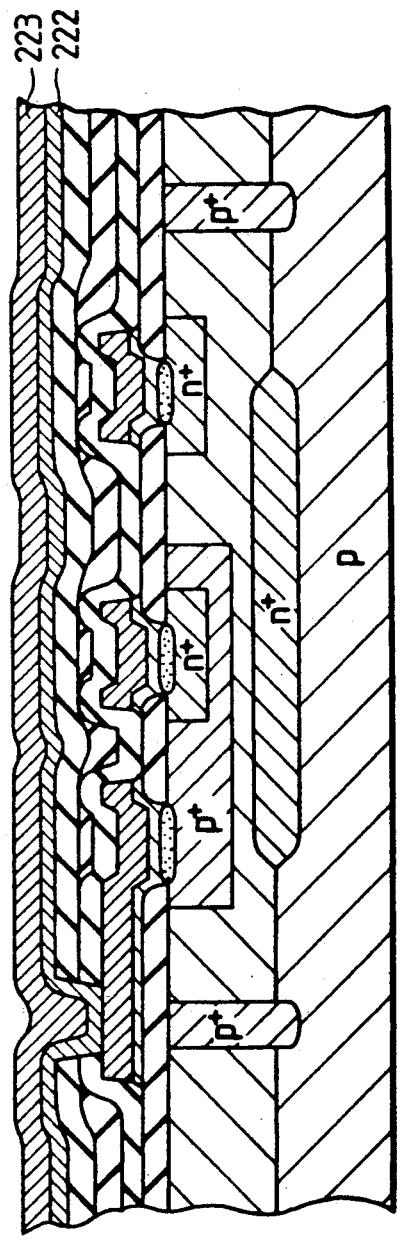

FIG. 25 shows the case where TiW and aluminum alloy (composition is the same as that of the first aluminum layer) films are deposited on the whole surface of the wafer, the films having the same thicknesses as those of the aforementioned case, using the sputter deposition apparatuses 441 and 451 of FIG. 4 just like the case of the aforementioned first aluminum wiring layer. In FIG. 25, reference numeral 222 denotes a second TiW layer and 223 denotes a second aluminum layer.

Figure 26:
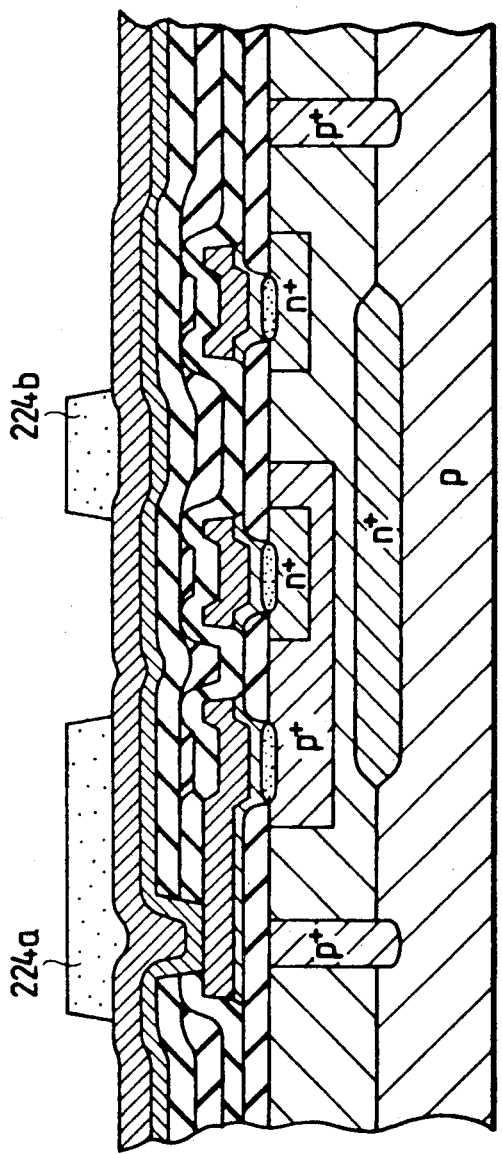

FIG. 26 shows the case where photoresist patterns 224a and 224b are formed to pattern the second aluminum wiring layer by photolithography.

Figure 27:
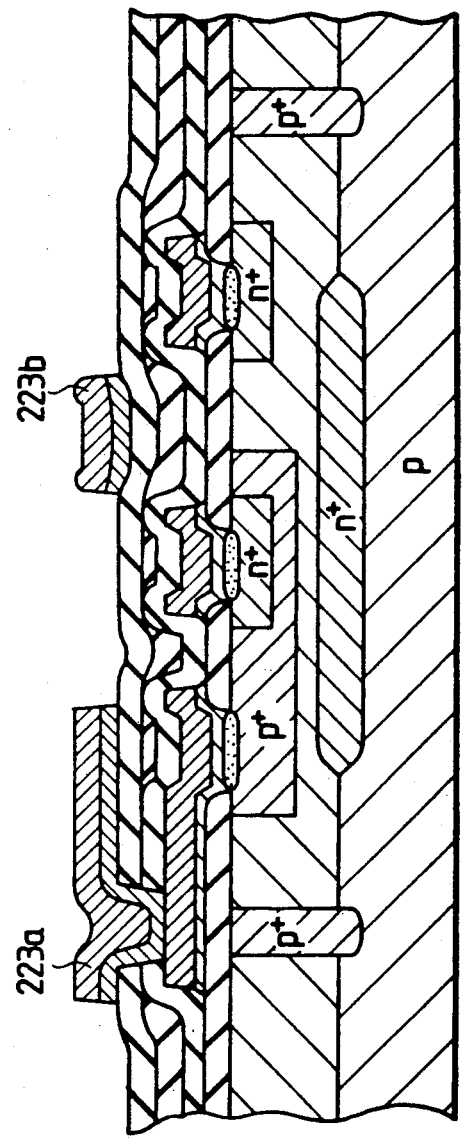

FIG. 27 shows the case where the wafer having the photoresist film forming the above pattern is processed by the aluminum dry etcher 541 and the oxygen asher 551 of FIG. 5, in order to form second wiring patterns 223a and 223b.

Figure 28:
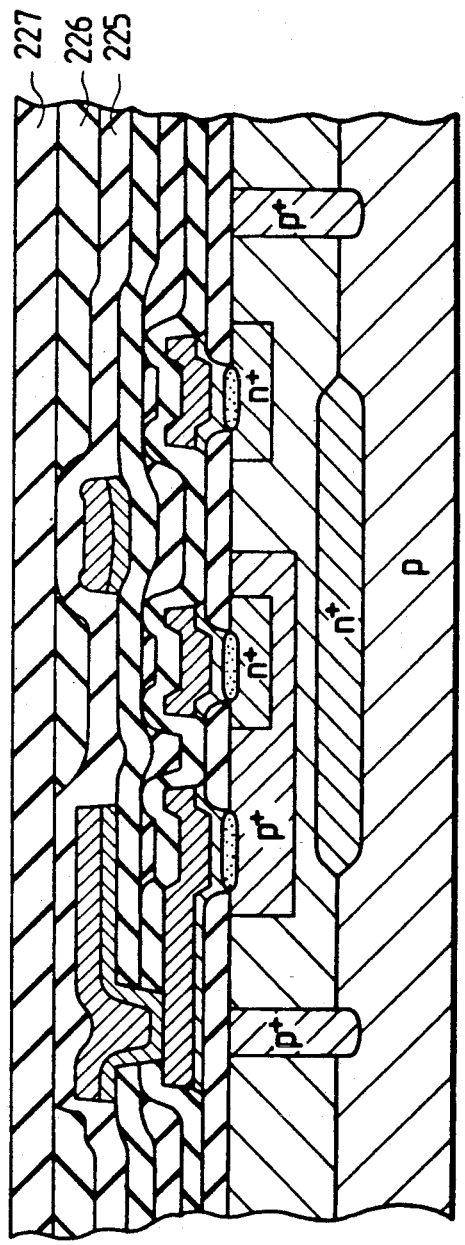

FIG. 28 shows the case where there are deposited a lower CVD SiO₂ film 225 that constitutes the final passivation film, an intermediate flat SOG-SiO₂ film 226 (which has been etched back), and an upper CVD-SiO₂ film 227 by the same method as the aforementioned interlayer insulating film using the continuous processing apparatus of FIG. 6.

FIG. 19 is a sectional view schematically illustrating the state where the completed wafer is divided and is fabricated, and wherein reference numeral 228 denotes a bonding pad formed using the second aluminum wiring layer, 229 denotes an opening exposing the pad, 230 denotes a ball portion in the ball wedge bonding, 231 denotes a gold wire having a diameter, illustratively, of 25 μm, 232 denotes a sealing epoxy resin, 233 denotes an Au-Si eutectic adhesive layer, and reference numeral 234 denotes a metal die pad that constitutes a portion of the lead frame.

Figure 30:
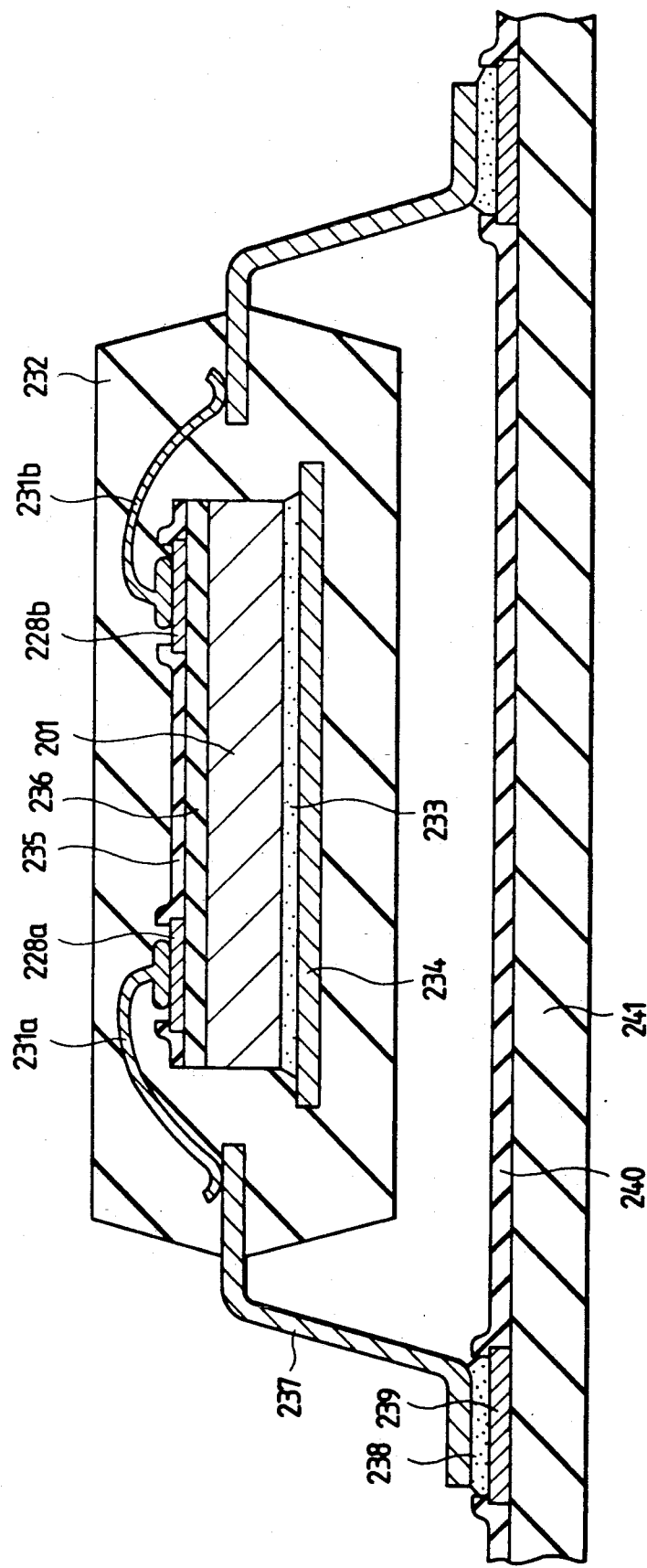

FIG. 30 shows the case where the completed device is mounted on a wiring substrate by the VPS (vapor phase soldering) method, and wherein reference numeral 201 denotes a silicon substrate, 228a and 228b denote aluminum bonding pads, 231a and 231b denote gold bonding wires, 232 denotes a sealing resin, 235 denotes a final passivation film, 236 denotes a lower passivation film (including an interlayer SiO₂ film), 237 denotes an external lead, 238 denotes solder, 239 denotes an electrode, 240 denotes a solder resist film, and 241 denotes a PCB (printed circuit board).

The flow of the production process according to this embodiment will now be described in conjunction with FIGS. 8 to 30.

First, the wafer 201 is processed up to the step of emitter diffusion and opening of contact windows as shown in FIG. 8 according to an ordinary bipolar IC process and is loaded on the load lock apparatus 301 of FIG. 3 via the door 302 with the batch as a unit. A nitrogen gas is permitted to flow for five minutes in the load lock apparatus 301, and the atmosphere in the load lock chamber 304 is substituted with the nitrogen gas maintaining the pressure of 1 atm. Next, the wafer 201 (371) is transferred via the door 312 to the spinner 311 in the nitrogen atmosphere, and is supported by the stage 316 as shown in FIG. 35 and held thereon by suction. Next, the etching liquid (HF:NH₄F=1:20, liquid temperature of 25° C.) is sprayed from the chemical liquid nozzle 394 of FIG. 35 for 10 seconds while revolving the wafer 371 on the sage 316 at a low speed, in order to remove spontaneously oxidized films 209a to 209c on the openings as shown in FIG. 9. After the etching, washing water is sprayed from a pure water nozzle 393 (FIG. 35) while the wafer is being rotated so that the etching no more proceeds, and the wafer 371 is washed with water for five minutes. Thereafter, supply of the water is stopped, and nitrogen gas is supplied from the nitrogen nozzle 392 while rotating the wafer 371 at a speed as fast as 3000 rpm to dry it.

Next, the wafer is transferred to the vacuum bake chamber 324 via the door 322 (FIG. 3). The door 322 is closed and the nitrogen gas is evacuated to produce a vacuum condition. Next, the wafer heating lamp is turned on to heat the wafer at 300° C. to 500° C., and vacuum baking is effected for five minutes. Water adsorbed by the wafer is completely removed therefrom by the vacuum baking.

Next, the door 332a is opened, the wafer is carried by the robot arm 337 to the vacuum carrier chamber 334, and the door 332a is closed. The door 332b is opened, and the wafer is transferred to the sputter chamber 344 under the vacuum condition and is placed on the stage 348. Referring to FIG. 31, the platinum target 372 is opposed, and a platinum film 211 is deposited on the whole main surface of the wafer to a thickness of 20 to 500 angstroms, as shown in FIG. 10, by the so-called DC magnetosputtering method under the conditions of an argon gas of 10 mTorr, DC sputtering power of 1 KW and a wafer temperature of 200° C.

Then, the wafer is transferred to the annealing chamber 354 under a vacuum condition via the vacuum carriage chamber 334 in a manner as mentioned above. Oxygen gas is introduced into the annealing chamber so that the pressure is 10 to 700 Torr, and the wafer to be processed is placed on the hot plate (illustratively, the hot plate is at a temperature of 100° C.–400° C.) and is heated for 5 to 10 minutes to anneal it with oxygen. The openings only are selectively changed into silicide regions 212a to 212c as shown in FIG. 11.

Next, the annealing chamber 354 is returned to the vacuum condition in a manner as described above, the wafer is transferred to the load lock chamber 364 via the vacuum carriage chamber 334, the door 332d is closed to return the pressure to the atmospheric pressure, and the wafers are discharged in a batchwise manner through the door 362. As described above, the processings are continuously carried out in a controlled atmosphere, and no spontaneously oxidized film is formed between silicon and platinum and good contact is obtained. Here, the oxygen annealing may be carried out using a separate apparatus.

The wafer under the condition of FIG. 11 is processed by the continuously processing apparatus of FIG. 4. That is, the cassette 403 holding 20 to 25 wafers is set into the load lock chamber via the door 402. After setting, purging is effected with nitrogen gas for five minutes to substituted the atmosphere in the load lock chamber; i.e., the load lock chamber is filled with a nitrogen atmosphere of 1 atm.

Next, a wafer (one wafer) is transferred via the door 412 (FIG. 4) to the spin etcher unit block 411 maintained in he nitrogen gas of 1 atm. The wafer is supported by the spinner stage 415, and held thereon by suction, and is revolved at a low speed. Under this condition, a platinum-removing liquid ($HNO_3:HCl=1:8$, 50° C.) is sprayed from the chemical liquid nozzle 394 as shown in FIG. 35 to effect the processing for 10 minutes in order to remove unnecessary platinum film, as shown in FIG. 12. When the etching is completed, washing water is sprayed from the pure water nozzle 393 (FIG. 35) for one minute and the etching is discontinued. When the washing with water is completed, furthermore, a light etching solution ($HF:NH_4F=1:20$) is sprayed from the nozzle 396 (FIG. 35) for 20 seconds while keeping the wafer revolving, in order to remove the silicon oxide film on the platinum silicide. Under this condition, furthermore, the washing water is sprayed from the pure water nozzle 393 fro about five minutes to stop the reaction and to execute washing with water. Then, revolution of the spinner is increased to 3000 rpm, and nitrogen gas is emitted from the nitrogen gas nozzle 392 (FIG. 35) to dry the wafer. Next, under the same conditions as the case of FIG. 3, vacuum baking is effected in the bake chamber 424. Then, like the aforementioned case of FIG. 3, the wafer is transferred under the vacuum condition to the TiW (or TiN) sputtering chamber 444 via the vacuum carriage chamber 434. Referring to FIG. 31, the wafer 371 to be processed is placed on the insulated wafer stage 348, argon gas is supplied from the gas nozzle 378, the TiW target (titanium target in the case of TiN) is set adjacent to the opposing cathode 375, and electric power of about 1 KW is applied by the magnetosputtering method in order to deposit a TiW film on the whole main surface of the wafer, to a thickness of 200 to 1000 angstroms. In the case of TiN, argon and nitrogen gases are supplied from the gas supply nozzle 378 (FIG. 31) at a flow ratio of 1 ($Ar/N_2=1$) so that the pressure in the reaction chamber 344 is 3 to 10 mTorr. The wafer on which the underlying metal layer is deposited is transferred into the aluminum sputtering chamber 454 (FIG. 4) under the vacuum condition via the vacuum carriage chamber 434 in a manner as described earlier.

Referring to FIG. 31, the wafer 371 is placed on the insulating stage 348 (458 in FIG. 4), an aluminum alloy target 372 having a predetermined composition (illustratively, 1% by weight of silicon, 3% by weight of copper, and the rest being aluminum) is placed opposed thereto, and argon gas is supplied from the nozzle 378 so that the pressure in the processing chamber 344 (454 in FIG. 4) is 10 mTorr to effect the aluminum sputtering. The aluminum film has a thickness of 5000 to 10000 angstroms as shown in FIG. 13, and 5 KW of electric power is supplied to the target. When the deposition of aluminum is completed, the processing chamber 454 (FIG. 4) is evacuated again into a vacuum condition, and the wafer to be processed is transferred into the unload chamber 464 under a vacuum condition via the vacuum carriage chamber 434. When the wafers in the cassette are all held in the unload cassette 463 like in the case of FIG. 3, the interior of the unload chamber is returned back to the atmospheric pressure with the doors 432d and 462 being closed. The door 462 is then opened, and the cassette and the wafers are then emitted ($N_2$ vent).

Next, on the wafer of FIG. 13 are formed photoresist patterns 215a to 215c for patterning the first aluminum wiring layer by photolithography as shown in FIG. 14.

Next, the wafers on which the photoresist patterns 215a to 215c are formed as shown in FIG. 14 are held in a batchwise manner in the cassette and are set in the load chamber 504 of FIG. 5. The door 502 is closed and the interior of the load chamber 504 is evacuated. Then, the door 532d is opened and the wafers (piece by piece) are transferred into the aluminum etching chamber 544 (FIG. 5) via the door 532d, the vacuum carriage chamber and the door 532c. The wafer 571 is set onto the wafer stage 548 on the electrode 582 as shown in FIG. 32, and the door 532c is closed. Under this condition, a DC bias of $-200$ to $-500$ V and a predetermined RF bias are applied to the electrode 582 while a reaction gas ($BCl_3:CF_4:Cl_2:CHF_3=15:1:2:3$) is supplied from the reaction gas supply nozzle 578 (FIG. 32), and reactive ion etching is effected under the condition of 10 to 50 mTorr. FIG. 15 shows the state where the dry etching is completed.

Then, the etching chamber 544 (FIG. 5) is evacuated again in the same manner as described above, and the wafer 571 to be processed is transferred into the oxygen asher 554 under the vacuum condition via the vacuum carriage chamber. When the wafer is set onto the stage 558, the door 532b is closed, the resist film is subjected to plasma ashing with oxygen gas of 100 mTorr (RF power of 200 W to 700 W), and the resist film is removed as shown in FIG. 16. After removal of the resist film, the asher 554 is evacuated, and the wafer is transferred under a vacuum condition into the load lock chamber 524 via the vacuum carriage chamber 534 (FIG. 5).

When the wafer is placed on the carriage belt 525 (FIG. 5), the door 532a is closed and the load lock chamber 524 is filled with nitrogen gas maintaining a pressure of 1 atm. Under this condition, the wafer is transferred via door 522 onto the spinner 514 in nitrogen gas of 1 atm., and the door 522 is closed again. The wafer supported on the spin stage 316, and held thereon by suction, is revolved at a low speed as shown in FIG. 35, and pure water is sprayed from the pure water nozzle 393 (FIG. 35) for 10 minutes to remove chlorine components that form crystals of aluminum corrosion. After washing with water, nitrogen gas is supplied from the gas nozzle 392 and the stage 316 is revolved at a speed as high as 3000 rpm to disperse water from the wafer. After the processing, the wafer is transferred into the cassette 563 in the unload chamber 564 filled with nitrogen gas of 1 atm. When the whole lot is held in the cassette, the door 512 is closed and the cassette 563 and the wafers are discharged from the door 562. Through the continuous processing, as described above, corrosive gas such as $Cl_2$ that could not be removed with the $O_2$ asher is now completely removed by washing with water. Therefore, improved reliability is obtained even when there is used aluminum that contains copper.

Next, the wafers as shown in FIG. 16 are held in the cassette 603 with the lot as a unit and are set into the load lock chamber 604 of FIG. 6 through the door 602. When the setting is completed, the door 602 is closed and the load lock chamber 604 is evacuated. The wafer (one piece is transferred into the CVD chamber 644 under a vacuum condition through the vacuum carriage chamber 634. Referring to FIG. 33, the wafer 671 to be processed is placed on the stage 648 on the electrode 682, and the door 632c is closed. Under this condition, oxygen gas is supplied from the reaction gas supply tube 676 and the helium gas is supplied from the bubbler gas supply tube 678, and the CVD-SiO$_2$ film 216 is deposited by the plasma TEOS method so as to form a film thickness of 0.6 μm, as shown in FIG. 17. The depositing conditions are a helium gas flow rate of 300 sccm (standard cubic cm), an oxygen gas flow rate of 300 sccm, a wafer temperature of 370° C. to 410° C., a reaction chamber gas pressure of 7 to 11 Torr, and an RF power of 300 to 400 watts.

The wafer as shown in FIG. 17 is then transferred under a vacuum condition into an intermediate load lock chamber 624 via the vacuum carriage chamber 634 in a manner as described above. When the wafer is placed on the carriage belt 625 (FIG. 6), the door 632a is closed and nitrogen gas is supplied into the load lock chamber maintaining a pressure of 1 atm. Under this condition, the door 622 of the spin coater 614 filled with nitrogen of 1 atm. is opened, and the wafer is transferred to the coater 614. When the wafer is supported by the chuck 316 and held thereon by suction, as shown in FIG. 35, the door 622 is closed. Under the condition where the spin stage 316 is stopped, the SOG liquid (10% by weight of SiO$_2$ component) is permitted to drop in a predetermined amount on the wafer from the SOG dropping nozzle 395, and, then, the spin stage 316 is rotated at 2200±400 rpm to complete the coating. This condition is shown in FIG. 18.

Next, the wafer as shown in FIG. 18 is transferred into the bake chamber 624 filled with nitrogen gas of 1 atm. The doors 622 and 632a are closed, the wafer is baked at 80° C. for 10 minutes under ordinary pressure, the atmosphere is evacuated, and the wafer is transmitted into the etch back chamber 654 under a vacuum condition via the vacuum carriage chamber 634 in the same manner as described above. The door 632b is closed when the wafer 671 is set on the stage 658 as shown in FIG. 34. Under this condition, vacuum baking is effected in two steps at a wafer temperature of 200° C. (20 minutes) and 450° C. (20 minutes). Thereafter, unnecessary portions of the SOG film are removed by dry etching (so-called etch back) so that the SOG-SiO$_2$ film is not exposed on the through-holes. The etch back conditions are a reaction chamber gas pressure of argon of 20 to 50 mTorr. An RF power or 250 to 400 watts, a horizontal magnetic field intensity of 200 to 500 gauss, and an etching amount of 0.15 μm. FIG. 19 shows the state where the etch back is completed.

Next, the etch back chamber is evacuated, and the wafer as shown in FIG. 19 is carried under a vacuum condition to the CVD chamber 644 again via the vacuum carriage chamber 634 in the same manner as described above. In this chamber, the CVD-SiO$_2$ film 218 is deposited on the whole surface of the wafer so as to have a thickness of 0.6 μm, as shown in FIG. 20, under the same conditions as those of forming the aforementioned CVD film. The wafer under this condition is transferred under the vacuum condition into the cassette 603 in the unload chamber 604 via the vacuum carriage chamber 634. When all wafers in the cassette 603 are processed, the doors 632d and 602 are closed, the interior is filled with nitrogen gas of 1 atm. and the wafers and the cassette 603 are discharged via the door 602. Since the wafer is not exposed to open air after the SOG is formed as described above, there develops no such defect as "swelling" or "voids" that results when the SOG film absorbs water in the air.

Referring next to FIG. 21, the photoresist pattern 219 for forming through-holes is formed on the wafer by photolithography. The wafer under this condition is held in the cassette with the lot as a unit and is set in the load chamber 704 of FIG. 7. The door 702 is closed, the load chamber 704 is evacuated, the door 732d is opened, and the wafers (one piece by one piece) are transferred into the dry etching chamber 744 by the robot arm 737 via the vacuum chamber 734. When the wafer 571 is placed on the stage 548 as shown in FIG. 32, the door 732c is closed to subject the SiO$_2$ film to dry etching (reactive ion etching). The etching conditions are a reaction chamber pressure of 200 mTorr, a reaction gas of CHF$_3$ (supplied from the nozzle 578), and an RF power of 450 watts.

FIG. 22 shows the wafer having through-holes formed as described above. The dry etching chamber 744 is then evacuated. Then, the door 732c is opened, the wafer is held by the arm 737 in the evacuation chamber 734 in the same manner as described above, and is pulled into the chamber 734 like the others. Under this condition, the door 732c is closed like the others. Then, the door 732b of the asher 754 is opened and the wafer is transferred into the asher 654 by maintaining a vacuum. The resist is removed by O$_2$ ashing from the wafer set to the asher 754 as shown in FIG. 23. The ashing conditions are an O$_2$ gas of 1.2 Torr and an RF power of 800 watts.

The wafer under the condition of FIG. 23 is transferred into the vacuum carriage chamber 734 under a vacuum condition in the same manner as mentioned above. The door 732a is closed when the wafer is placed on the belt 725 of the load chamber 724, and nitrogen gas of 1 atm. is filled in the load chamber 724. Next, the door 722 is opened and the wafer is transferred to the wet processing chamber 714 (in nitrogen gas of 1 atm.). The door 722 is closed when the wafer 371 is supported on the spin stage 316 and held thereon by suction, as shown in FIG. 35. Under the condition where the spin stage 316 is revolving at a low speed, a positive-type resist developing liquid (NMD-3 produced by Tokyo Oka Co., chief component being N(CH$_3$)$_4$OH) is sprayed for 30 seconds from the chemical liquid nozzle (FIG. 35) in order to remove the side film 220 to obtain a state shown in FIG. 24. Under this condition of revolution, pure water is sprayed from the pure water nozzle 393 for 10 minutes to wash the wafer. Then, the revolving speed of the spinner is increased to 3000 rpm and nitrogen gas is supplied from the gas nozzle 392 (FIG. 35) to spin-dry the wafer. Thereafter, the door 712 is opened and the wafer is transferred to the cassette 763 in the unload chamber 764. The door 712 is then closed. After all of the wafers of the lot are held in the cassette 763, the cassette and the wafers are discharged from the door 762. After the dry processing as described above, wet processing is continuously carried out keeping out the open air, and aluminum at the bottom of through-holes is prevented from being corroded by the fluorine-containing gas.

Next, as shown in FIG. 25, the second aluminum wiring layers 222 and 223 are formed by the apparatus of FIG. 4 in the same manner as that of forming the aforementioned first aluminum wiring layer as shown in FIG. 25.

Referring next to FIG. 26, the photoresist patterns 224a and 224b of the same wiring layer are formed in the same manner as in FIG. 15.

Then, the etching is effected to form the structure shown in FIG. 27, using the apparatus of FIG. 5 in the same manner as the aforementioned first aluminum wiring.

Then as shown in FIG. 28, a final passivation film comprising three layers is formed using the apparatus of FIG. 6, in the same manner as the aforementioned interlayer insulating film. Even in this case, the etch back is so effected that the $SiO_2$ film by SOG will not be exposed on the side surfaces of the pad opening.

Figure 29:
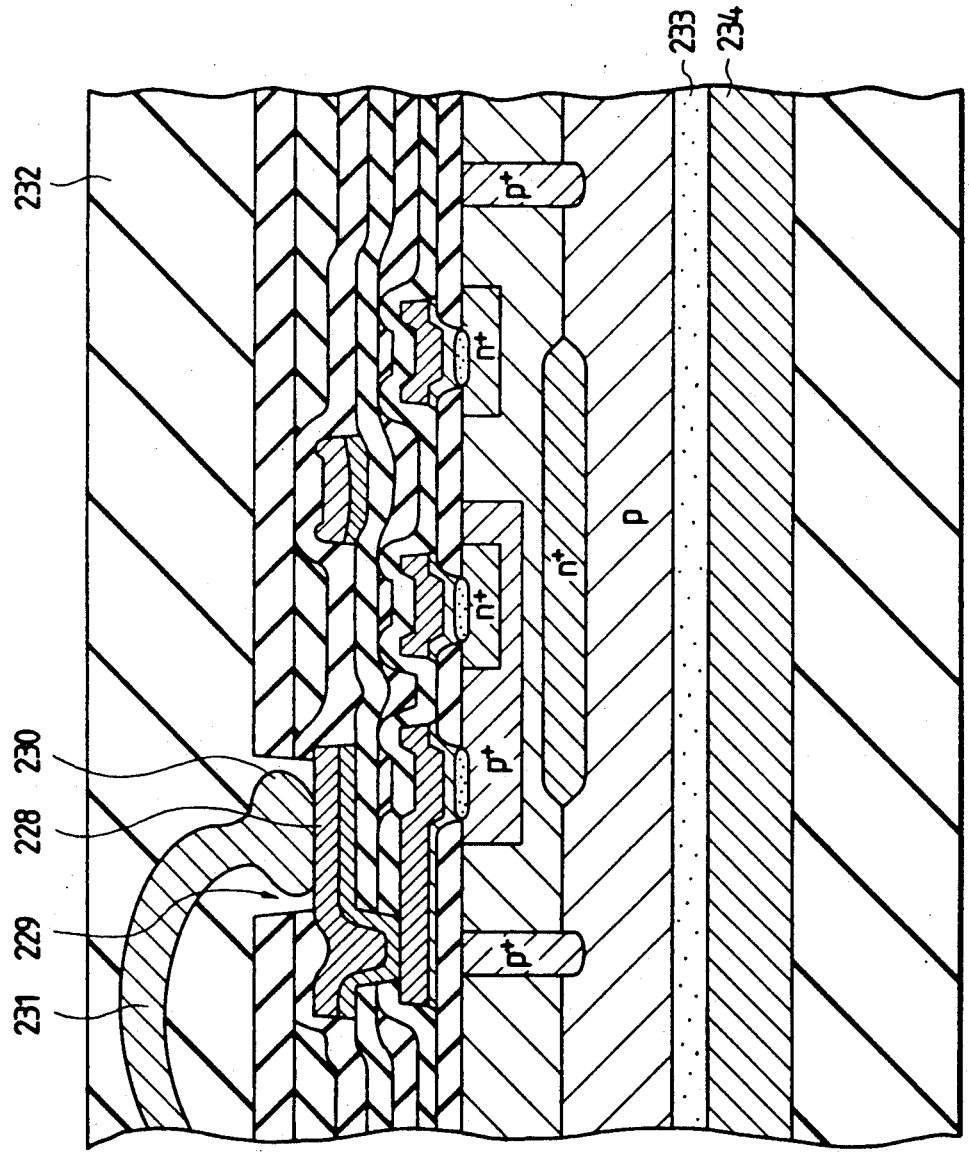

Then, the pad opening 229 is formed in the same manner as the through-hole as shown in FIG. 29. Like the aforementioned through-hole, the apparatus of FIG. 7 is used in the same manner as for the previously described through-hole, through the interlayer insulating film.

While I have shown and described several embodiments in accordance with the present invention, it is understood that the same is not limited thereto, but is susceptible to numerous changes and modifications as known to one having ordinary skill in the art, and I therefore do not wish to be limited to the details shown and described herein, but intend to cover all such modifications as are encompassed by the scope of the appended claims.

What is claimed is:

1. A method of producing semiconductor devices on a substrate, comprising a first step of dry processing the substrate and a second step of wet processing the substrate, wherein said step of dry processing and said step of wet processing are carried out without exposing the substrate to external air during the step of dry processing and the step of wet processing and during transfer of the substrate between the steps of dry and wet processing.

2. A method of producing semiconductor devices according to claim 1, wherein the first step of dry processing is performed at a first processing station and the second step of wet processing is performed at a second processing station, and wherein the method includes the further step of carrying the substrate between the first processing station and the second processing station, with the first step of dry processing, the further step of carrying the substrate between the first and second processing stations, and the second step of wet processing being carried out without exposing the substrate to the external air.

3. A method of producing semiconductor devices according to claim 2, wherein the first step of dry processing, the further step of carrying the substrate, and the second step of wet processing are carried out in a continuous sequence.

4. A method of producing semiconductor devices according to claim 3, wherein the first step of dry processing, the further step of carrying the substrate, and the second step of wet processing are carried out in predetermined atmospheres.

5. A method of producing semiconductor devices according to claim 4, wherein at least part of the further step of carrying the substrate is carried out under vacuum conditions.

6. A method of producing semiconductor devices according to claim 2, wherein the further step of carrying the substrate between the first processing station and the second processing station includes transferring the substrate to a third processing station.

7. A method of producing semiconductor devices according to claim 1, including the further step of carrying the substrate between the wet and dry processing, with the respective first and second steps of dry and wet processing, and the further step of carrying the substrate, being carried out without exposing the substrate to the external air.

8. A method of producing semiconductor devices according to claim 7, wherein the first and second steps of dry and wet processing, respectively, and the further step of carrying the substrate, are carried out in predetermined atmospheres.

9. A method of producing semiconductor devices according to claim 1, wherein the substrate is a semiconductor wafer.

10. A method of producing semiconductor devices according to claim 1, wherein said first step of dry processing includes forming a thin film on the substrate, and said second step of wet processing includes washing the substrate and drying the substrate after the washing, the second step being performed before the first step whereby the substrate is washed and dried before forming the thin film.

11. A method of producing semiconductor devices according to claim 1, wherein said first step of dry processing includes etching a thin film on the substrate, and said second step of wet processing includes washing the substrate, the second step being performed after the first step whereby the washing is performed after said etching.

12. A method of producing semiconductor devices according to claim 10, wherein the thin film has a barrier metal structure.

13. A method of producing semiconductor devices according to claim 12, wherein the barrier metal structure includes a first layer, adjacent the substrate, of a material selected from the group consisting of Ti, TiW and MoSi, and an aluminum-containing layer on the first layer.

14. A method of producing semiconductor devices on a substrate, comprising the steps of:
(a) a first processing step carried out in a first processing chamber to effect a first processing, said first processing being one of a dry processing and a wet processing of the substrate;
(b) a first transfer step for transferring said substrate into a second processing chamber in an atmosphere different from external air, without permitting the substrate to come in contact with the external air after said first processing step has been completed; and
(c) a second processing step carried out in a second processing chamber to effect the other of the dry processing and the wet processing, after said first transfer step has been completed.

15. A method of production according to claim 14, wherein the first transfer step is performed by transferring the substrate from the first processing chamber, through an intermediary processing chamber, into the second processing chamber, an atmosphere in the intermediary processing chamber being different from the external air, the substrate being transferred from the first processing chamber, through the intermediary processing chamber, and into the second processing chamber, without coming into contact with the external air.

16. A method of production according to claim 15, wherein the first transfer step is performed in a vacuum.

17. A method of production according to claim 15, wherein said first processing step is a dry processing.

18. A method of production according to claim 17, wherein the substrate includes an aluminum film, and wherein said first processing step is for dry-etching the aluminum film to pattern the aluminum so as to form a wiring layer of aluminum.

19. A method of production according to claim 18, wherein said second processing step is a wet processing step which removes a halogen-containing component that remains on the substrate at the time of etching the aluminum.

20. A method of production according to claim 17, wherein said first processing step is a chemical vapor deposition step for depositing a first oxide film.

21. A method of production according to claim 20, wherein said second processing step is a step for applying a spin-on-glass oxide film so as to form a flattened surface on an uneven surface of said first oxide film.

22. A method of production according to claim 21, further comprising:
(d) a second transfer step for transferring said substrate into a third processing chamber without permitting the substrate to come in contact with external air after said second processing step has been completed; and
(e) a step for uniformly thinning at least part of the spin-on-glass oxide film and the first chemical vapor deposition oxide film by dry etching from an upper direction thereof.

23. A method of production according to claim 22, further comprising:
(f) a third transfer step for transferring said substrate into a fourth processing chamber that is different from said second and third processing chambers without permitting it to come in contact with external air after step (e) has been finished; and
(g) a step for depositing a second chemical vapor deposition oxide film on the whole surface of the spin-on-glass oxide film that has been thinned uniformly.

24. A method of production according to claim 23, further comprising:
(h) a step for forming through-holes in at least said first and second chemical vapor deposition oxide films after the step of depositing said second chemical vapor deposition oxide film.

25. A method of production according to claim 24, wherein the spin-on-glass oxide film is uniformly thinned such that the second chemical vapor deposition oxide film is provided on the first chemical vapor deposition oxide film without the spin-on-glass oxide film therebetween at the location of the through-holes, such that the first and second chemical vapor deposition oxide films form boundary surfaces of the through-holes and the spin-on-glass oxide film does not form a boundary surface of the through-holes.

26. A method of production according to claim 23, wherein said fourth processing chamber is the same chamber as said first processing chamber.

27. A method of production according to claim 22, wherein the third processing chamber is the same chamber as the first processing chamber.

28. A method of producing semiconductor devices on a substrate, comprising a first step of dry processing the substrate and a second step of wet processing the substrate, wherein the first step of dry processing is performed at a first processing station and the second step of wet processing is performed at a second processing station; and a further step of carrying the substrate between the first processing station and the second processing station, with the first step of dry processing, the further step of carrying the substrate between the first and second processing stations, and the second step of wet processing being carried out without exposing the substrate to external air;
wherein the first and second processing stations are separate stations spaced from each other; and
wherein the further step of carrying the substrate transports the substrate in a chamber extending between the first and second processing stations.

29. A method of producing semiconductor devices on a substrate, comprising a first step of dry processing the substrate and a second step of wet processing the substrate, wherein the first step of dry processing is performed at a first processing station and the second step of wet processing is performed at a second processing station; and a further step of carrying the substrate between the first processing station and the second processing station, with the first step of dry processing, the further step of carrying the substrate between the first and second processing stations, and the second step of wet processing being carried out without exposing the substrate to external air, and with the further step of carrying the substrate between the first processing station and the second processing station including transferring the substrate to a third processing station;
wherein the first processing station has a different atmosphere than the second processing station; and
wherein, in the third processing station, the atmosphere is changed from the atmosphere of the processing station, of the first and second stations, that the substrate has previously been in, to the atmosphere of the processing station, of the first and second processing stations, to which the substrate is being carried.

30. A method of producing semiconductor devices on a substrate, comprising a first step of dry processing the substrate and a second step of wet processing the substrate, wherein the first step of dry processing is performed at a first processing station and the second step of wet processing is performed at a second processing station; and a further step of carrying the substrate between the first processing station and the second processing station, with the first step of dry processing, the further step of carrying the substrate between the first and second processing stations, and the second step of wet processing being carried out without exposing the substrate to external air;
wherein the atmosphere at the second processing station, during the wet processing, is a nitrogen atmosphere; and
wherein the first step of dry processing is carried out under vacuum conditions.

31. A method of producing semiconductor devices according to claim 30, wherein at least part of the further step of carrying the substrate is carried out under vacuum conditions.

32. A method of producing semiconductor devices on a substrate, comprising a first step of dry processing the substrate and a second step of wet processing the substrate, wherein said first step of dry processing and said second step of wet processing are carried out without exposing the substrate to external air during the first and second steps and in transferring the substrate between the first and second steps;

wherein said first step of dry processing includes forming a thin film on the substrate, and said second step of wet processing includes washing the substrate and drying the substrate after the washing, the second step being performed before the first step whereby the substrate is washed and dried before forming the thin film; and wherein the thin film is a thin metal film.

33. A method of producing semiconductor devices according to claim 32, wherein the thin film has a barrier metal structure.

34. A method of producing semiconductor devices according to claim 33, wherein the barrier metal structure includes a first layer, adjacent the substrate of a material selected from the group consisting of Ti, TiW and MoSi, and an aluminum-containing layer on the first layer.

35. A method of producing semiconductor devices according to claim 32, wherein said thin metal film is formed by sputtering.

36. A method of producing semiconductor devices on a substrate, comprising a first step of dry processing the substrate and a second step of wet processing the substrate, wherein said step of dry processing and said step of wet processing are carried out without exposing the substrate to external air during the first and second steps and in transferring the substrate between the first and second steps;

wherein said first step of dry processing includes etching a thin film on the substrate;

wherein said second step of wet processing includes washing the substrate after said etching; and wherein the thin film on said substrate is a thin metal film.

37. A method of producing semiconductor devices on a substrate, comprising a first step of dry processing the substrate and a second step of wet processing the substrate, wherein said step of dry processing and said step of wet processing are carried out without exposing the substrate to external air during the first and second steps and in transferring the substrate between the first and second steps;

wherein said first step of dry processing includes etching a thin film on the substrate, and said second step of wet processing includes washing the substrate after said etching; and wherein the thin film has a barrier metal structure.

38. A method of producing semiconductor devices according to claim 37, wherein the barrier metal structure includes a first layer, adjacent the substrate, of a material selected from the group consisting of Ti, TiW and MoSi, and an aluminum-containing layer on the first layer.

39. A method of producing semiconductor devices on a substrate, comprising a first step of dry processing the substrate and a second step of wet processing the substrate, wherein said step of dry processing and said step of wet processing are carried out without exposing the substrate to external air during the first and second steps and in transferring the substrate between the first and second steps; and wherein said first step of dry processing includes forming a first insulating film on the substrate, and the second step of wet processing includes forming a second insulating film, on the first insulating film.

40. A method of producing semiconductor devices according to claim 39, wherein the second insulating film is an oxide film formed by a spin-on-glass coating technique.

* * * * *